US012707995B2

(12) United States Patent
Ohmori

(10) Patent No.: US 12,707,995 B2
(45) Date of Patent: Aug. 11, 2026

(54) SEMICONDUCTOR DEVICE WITH A SURFACE OF A SEMICONDUCTOR BODY EXPOSED THROUGH AN OPENING IN A SEALING RESIN

(71) Applicant: ROHM CO., LTD., Kyoto (JP)

(72) Inventor: Kengo Ohmori, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 598 days.

(21) Appl. No.: 18/248,799

(22) PCT Filed: Sep. 16, 2021

(86) PCT No.: PCT/JP2021/034087
§ 371 (c)(1),
(2) Date: Apr. 12, 2023

(87) PCT Pub. No.: WO2022/080081
PCT Pub. Date: Apr. 21, 2022

(65) Prior Publication Data
US 2024/0006364 A1 Jan. 4, 2024

(30) Foreign Application Priority Data
Oct. 16, 2020 (JP) ................................ 2020-174411

(51) Int. Cl.
*H10W 70/40* (2026.01)
*H10W 40/22* (2026.01)
(Continued)

(52) U.S. Cl.
CPC ......... *H10W 70/465* (2026.01); *H10W 40/22* (2026.01); *H10W 74/141* (2026.01);
(Continued)

(58) Field of Classification Search
CPC ....................................................... H01L 24/16
(Continued)

(56) References Cited

U.S. PATENT DOCUMENTS 5,450,283 A * 9/1995 Lin .................. H01L 23/49816 174/16.3
2004/0051168 A1 * 3/2004 Arai .................... H01L 25/0657 438/106
(Continued)

FOREIGN PATENT DOCUMENTS

JP 2000164617 A * 6/2000 ............. H01L 24/05
JP 2004-031607 1/2004
(Continued)

OTHER PUBLICATIONS

International Search Report issued in International Application No. PCT/JP2021/034087, Dec. 14, 2021, 3 pages.
(Continued)

*Primary Examiner* — Ajay Arora
(74) *Attorney, Agent, or Firm* — HSML P.C.

(57) ABSTRACT

A semiconductor device includes a conductor, a semiconductor element, and a sealing resin. The conductor has an obverse surface facing in the thickness direction. The semiconductor element includes an element body and a plurality of electrodes connected to the element body and bonded to the obverse surface. The sealing resin covers the semiconductor element. The sealing resin has a top surface facing the same side as the obverse surface in the thickness direction, and an opening penetrating the top surface in the thickness direction. The element body is exposed through the opening.

20 Claims, 17 Drawing Sheets

(51) Int. Cl.
*H10W 74/10* (2026.01)
*H10W 72/20* (2026.01)
*H10W 90/00* (2026.01)

(52) U.S. Cl.
CPC ........ *H10W 72/223* (2026.01); *H10W 72/234* (2026.01); *H10W 74/142* (2026.01); *H10W 90/726* (2026.01)

(58) Field of Classification Search
USPC .......................................................... 257/734
See application file for complete search history.

(56) References Cited

U.S. PATENT DOCUMENTS

2007/0296079 A1* 12/2007 Huang ................ H01L 23/4334 257/E23.125
2012/0315727 A1* 12/2012 Zhang ................. H01L 23/3185 257/E21.599
2013/0252383 A1* 9/2013 Chen ................... H01L 21/4857 257/E21.508
2018/0342438 A1* 11/2018 Chen ................. H01L 23/49568

FOREIGN PATENT DOCUMENTS

JP 2004-235583 8/2004
JP 2007-335742 12/2007
JP 2008-124176 5/2008
JP 2018-085522 5/2018
JP 2020-077723 5/2020

OTHER PUBLICATIONS

Office Action issued in corresponding Japanese Patent application No. 2022-557297, May 27, 2025, and machine translation (8 pages).

* cited by examiner

SEMICONDUCTOR DEVICE WITH A SURFACE OF A SEMICONDUCTOR BODY EXPOSED THROUGH AN OPENING IN A SEALING RESIN

TECHNICAL FIELD

The present disclosure relates to a semiconductor device with a semiconductor element that is flip-chip-bonded.

BACKGROUND ART

A semiconductor device with a semiconductor element bonded to a conductor (e.g., a lead frame) by flip-chip bonding is conventionally known. An example of such a semiconductor device is disclosed in Patent Document 1.

In the semiconductor device, a plurality of electrodes of a semiconductor element (a semiconductor chip in Patent Document 1) are bonded to a conductor (lead-out wirings in Patent Document 1) via a bonding layer (conductive bumps in Patent Document 1). The electrodes of the semiconductor element face the conductor.

During the use of the semiconductor device, the heat generated from the semiconductor element is dissipated to the outside through the electrodes and the conductor. When the semiconductor element is a switching element such as a MOSFET, the heat generated from the semiconductor element needs to be dissipated more quickly to the outside. Thus, improvement of the heat dissipation of the semiconductor device is demanded.

PRIOR ART DOCUMENT

Patent Document

Patent Document 1: JP-A-2018-85522

SUMMARY OF THE INVENTION

Problem to be Solved by the Invention

In light of the above-circumstances, an object of the present disclosure is to provide a semiconductor device capable of improving the heat dissipation.

Means for Solving the Problem

A semiconductor device provided according to the present disclosure includes: a conductor having an obverse surface facing in a thickness direction; a semiconductor element including an element body and a plurality of electrodes, the plurality of electrodes being connected to the element body and bonded to the obverse surface; and a sealing resin covering the semiconductor element. The sealing resin has a top surface facing the same side as the obverse surface in the thickness direction, and an opening penetrating the top surface in the thickness direction. The element body is exposed through the opening.

Preferably, the element body has a substrate made of a semiconductor material and a semiconductor layer located closer to the obverse surface than is the substrate in the thickness direction and electrically connected to the plurality of electrodes. The substrate has a base surface facing the same side as the obverse surface in the thickness direction, and the base surface is exposed through the opening.

Preferably, the base surface is flush with the top surface.

Preferably, the base surface is located further away from the obverse surface than is the top surface in the thickness direction.

Preferably, the base surface is located closer to the obverse surface than is the top surface in the thickness direction.

Preferably, the top surface includes an opening edge defining the opening, and the opening edge is located outwardly away from the base surface as viewed in the thickness direction.

Preferably, the sealing resin has as an opening surface connected to the opening edge and defining the opening, and the opening surface abuts a periphery of the base surface.

Preferably, the opening surface includes a first section located between the top surface and the obverse surface in the thickness direction and parallel to the top surface, and a second section connected to the first section and the opening edge, and the first section abuts the periphery of the base surface.

Preferably, the second section is inclined with respect to both the first section and the top surface.

Preferably, an area of the opening as viewed in the thickness direction gradually reduces from the top surface toward the obverse surface.

Preferably, the semiconductor device according to the present disclosure further includes a conductive bonding layer that bonds the obverse surface and the plurality of electrodes to each other. Each of the plurality of electrodes has a pad portion that is in contact with the element body and a columnar portion projecting from the pad portion in the thickness direction, and the columnar portion is in contact with the bonding layer.

Preferably, the columnar portion of each of the plurality of electrodes has an end surface opposing the obverse surface, and a side surface connected to the end surface and facing in a direction orthogonal to the thickness direction, and the bonding layer is in contact with the end surface and the side surface.

Preferably, the semiconductor element has a surface protective film opposing the obverse surface in the thickness direction and covering the element body. The end surface of each of the plurality of electrodes is located between the obverse surface and the surface protective film in the thickness direction.

Preferably, the pad portion and the columnar portion of each of the plurality of electrodes are in contact with the surface protective film.

Preferably, the columnar portion of each of the plurality of electrodes has a recess that is recessed from the end surface in the thickness direction, and the bonding layer is urged into the recess.

Preferably, the conductor includes a plurality of first leads and a plurality of second leads. The plurality of first leads are elongated in a first direction orthogonal to the thickness direction and spaced apart from each other in a second direction orthogonal to the thickness direction and the first direction. The plurality of second leads are spaced apart from the plurality of first leads in the second direction. The semiconductor layer contains a switching circuit and a control circuit electrically connected to the switching circuit. A first electrode of the plurality of electrodes is electrically connected to the switching circuit and bonded to the obverse surface of one of the plurality of first leads. A second electrode of the plurality of electrodes is electrically connected to the control circuit and bonded to the obverse surface of one of the plurality of second leads.

Preferably, the sealing resin covers a portion of each of the plurality of first leads and a portion of each of the plurality of second leads. Each of the first leads and each of the second leads have respective reverse surfaces opposite from the obverse surface in the thickness direction, and respective end surfaces connected to the obverse surface and the reverse surfaces and facing in a direction orthogonal to the thickness direction. The reverse surface and the end surface of each of the first leads and the reverse surface and the end surface of each of the second leads are exposed from the sealing resin.

Advantages of the Invention

The above-described configurations according to the present disclosure improve the heat dissipation of a semiconductor device.

Other features and advantages of the present disclosure will become apparent from the detailed description given below with reference to the accompanying drawings.

MODE FOR CARRYING OUT THE INVENTION

Modes for carrying out the present disclosure are described below with reference to the accompanying drawings.

Figure 1:
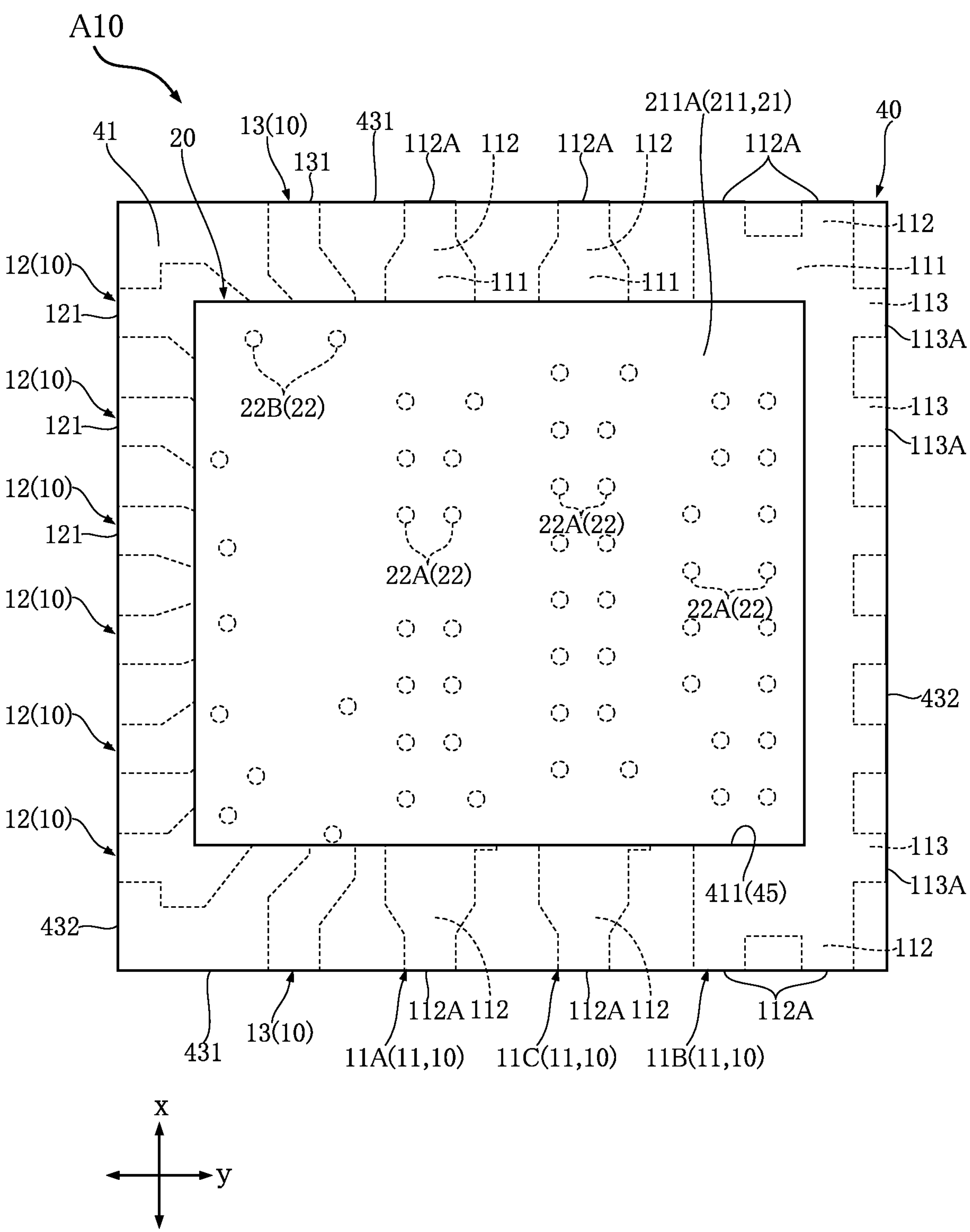
FIG. 1 is a plan view of a semiconductor device according to a first embodiment of the present disclosure.

A semiconductor device A10 according to a first embodiment is described below with reference to FIGS. 1 to 17. The semiconductor device A10 includes a conductor 10, a semiconductor element 20, a bonding layer 30, and a sealing resin 40. As shown in FIG. 1, the package type of the semiconductor device A10 is the QFN (Quad Flat Non-Lead Package). The semiconductor element 20 is an LSI of a flip-chip type. The semiconductor element 20 contains a switching circuit 212A and a control circuit 212B (both described later). In the semiconductor device A10, the switching circuit 212A converts DC power (voltage) to AC power (voltage). The semiconductor device A10 may be used for an element of a DC/DC converter circuit, for example. For convenience of understanding, the sealing resin 40 is shown as transparent in FIG. 2. Also, for convenience of understanding, the sealing resin 40 and the semiconductor element 20 (excluding a plurality of electrodes 22 and columnar portions 222 described later) are shown as transparent in FIG. 3. In these figures, respective contours of the semiconductor element 20 and the sealing resin 40 shown as transparent are indicated by imaginary lines (two-dot chain lines).

Figure 2:
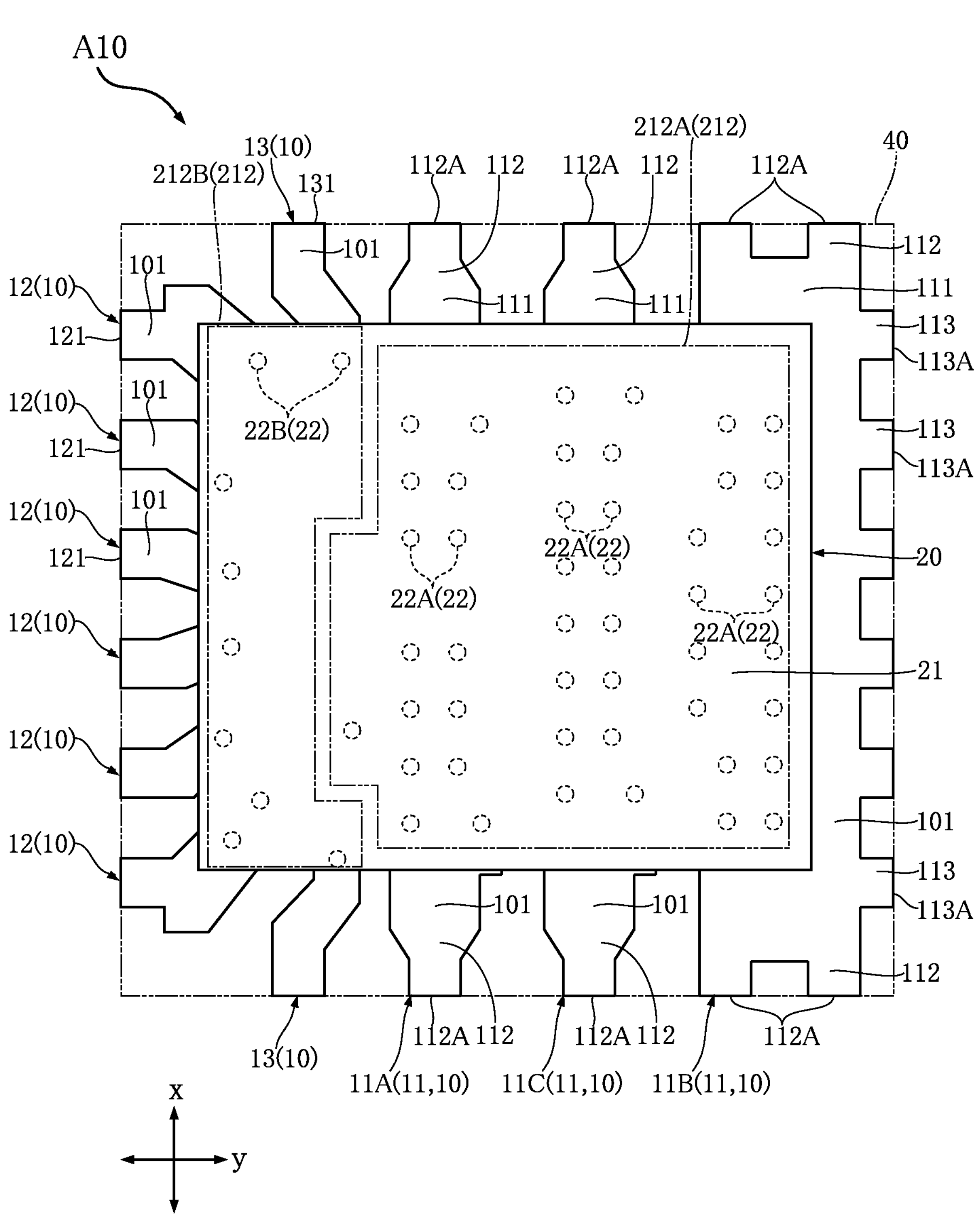
FIG. 2 is a plan view of the semiconductor device corresponding to FIG. 1, as seen through a sealing resin.

In the description of the semiconductor device A10, the thickness direction z of the conductor 10 is referred to as "thickness direction z". The direction orthogonal to the thickness direction z is referred to as "first direction x". The direction orthogonal to the thickness direction z and the first direction x is referred to as "second direction y". As shown in FIGS. 1 and 2, the semiconductor device A10 is rectangular as viewed in the thickness direction z. In the description of the semiconductor device A10, the side on which a plurality of second leads 12 (described later) are located in the second direction y is referred to as the "first side in the second direction y" for convenience. The side on which a plurality of first leads 11 (described later) are located in the second direction y is referred to as the "second side in the second direction y".

The conductor 10 supports the semiconductor element 20 as shown in FIG. 2 and also forms terminals for mounting the semiconductor device A10 to a circuit board. As shown in FIGS. 11 to 14, the conductor 10 is partially covered with the sealing resin 40. The conductor 10 has obverse surfaces 101 and reverse surfaces 102 facing away from each other in the thickness direction z. The obverse surfaces 101 face one side in the thickness direction z and oppose the semiconductor element 20. The semiconductor element 20 is supported on the obverse surfaces 101. The obverse surfaces 101 are covered with the sealing resin 40. The reverse surfaces 102 face the other side in the thickness direction z. The conductor 10 is constituted by a single lead frame. The lead frame may be made of a material containing copper (Cu) or a copper alloy, for example. The conductor 10 includes a plurality of first leads 11, a plurality of second leads 12, and a pair of third leads 13.

Figure 3:
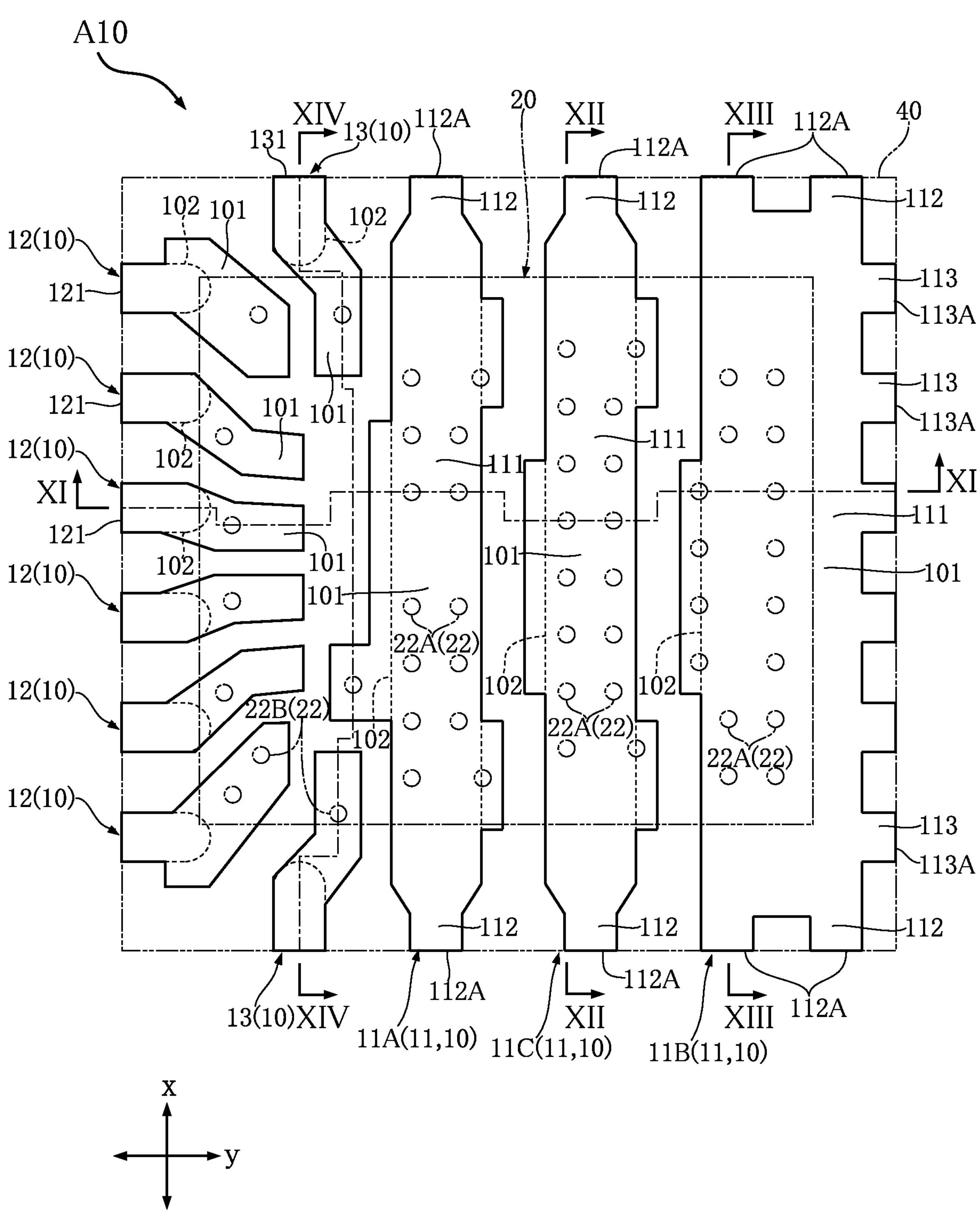
FIG. 3 is a plan view of the semiconductor device corresponding to FIG. 1, as seen through the sealing resin and a part of the semiconductor element.
Figure 4:
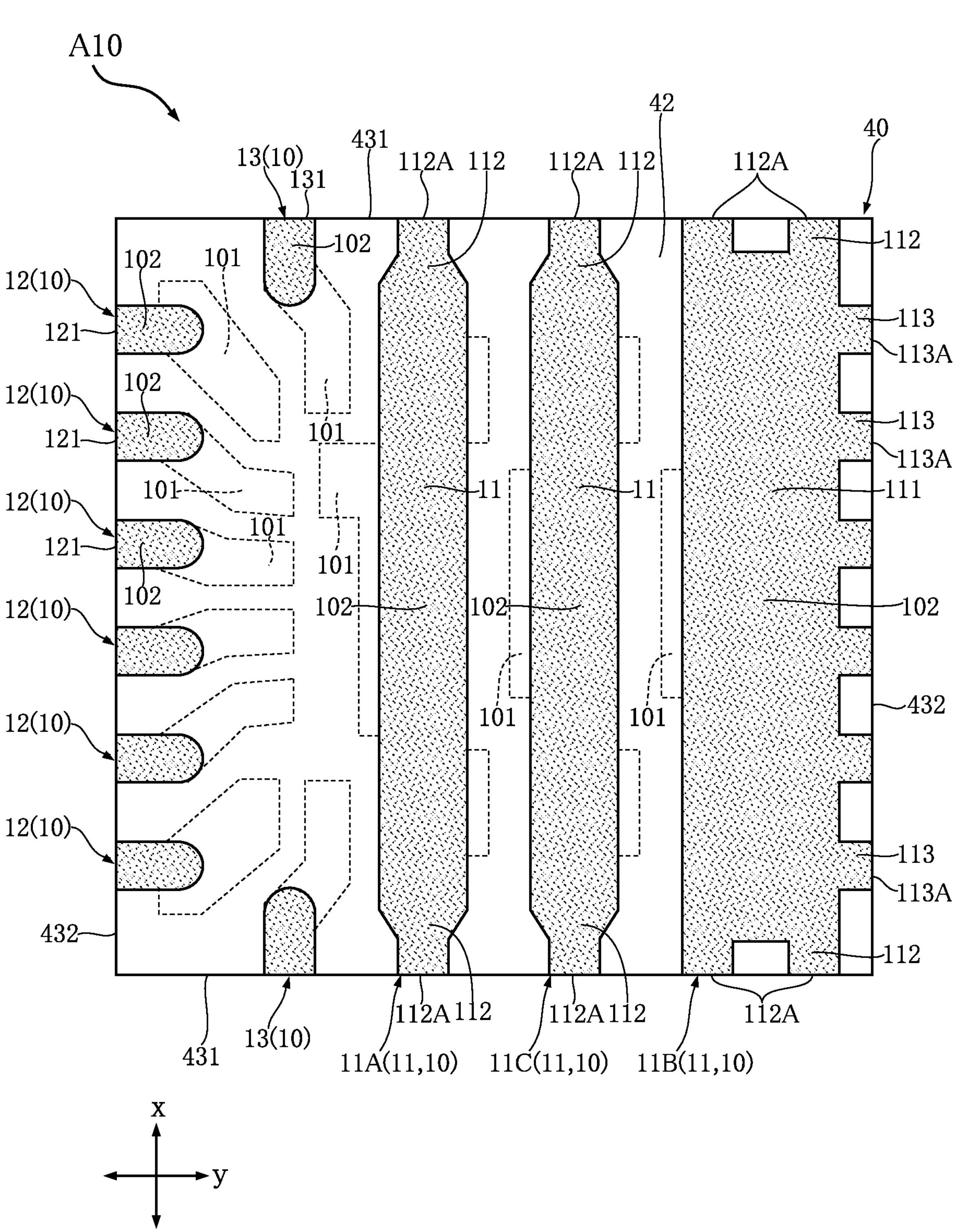
FIG. 4 is a bottom view of the semiconductor device shown in FIG. 1.

As shown in FIGS. 3 and 4, each of the first leads 11 is in the form of a strip elongated in the second direction y, as viewed in the thickness direction z. The first leads 11 are disposed side by side along the second direction y. In the example of the semiconductor device A10, the plurality of first leads 11 are constituted by three terminals: a first input terminal 11A, a second input terminal 11B, and an output terminal 11C. The plurality of first leads 11 are disposed in the order of the first input terminal 11A, the output terminal 11C, and the second input terminal 11B from the first side toward the second side in the second direction y. The first input terminal 11A and the second input terminal 11B receive DC power (voltage) for power conversion in the semiconductor device A10. The first input terminal 11A is a positive electrode (P terminal). The second input terminal 11B is a negative electrode (N terminal). The output terminal 11C outputs AC power (voltage) converted by the switching circuit 212A contained in the semiconductor element 20.

As shown in FIG. 3, the first input terminal 11A is located between the second leads 12 and the output terminal 11C in the second direction y. The output terminal 11C is located between the first input terminal 11A and the second input terminal 11B in the second direction y. Each of the first input terminal 11A and the output terminal 11C includes a main section 111 and a pair of side sections 112. As shown in FIGS. 3 and 4, each of the main sections 111 is elongated in the first direction x. The first leads 11 support the semiconductor element 20 on the obverse surfaces 101 of the main sections 111. The side sections 112 are connected to opposite ends of the main section 111 in the first direction x. As shown in FIGS. 3, 4, 12 and 13, each side section 112 has a first end surface 112A. The first end surfaces 112A are connected to both the obverse surfaces 101 and the reverse surfaces 102 of the first leads 11 and face in the first direction x. The first end surfaces 112A are exposed from the sealing resin 40.

Figure 9:
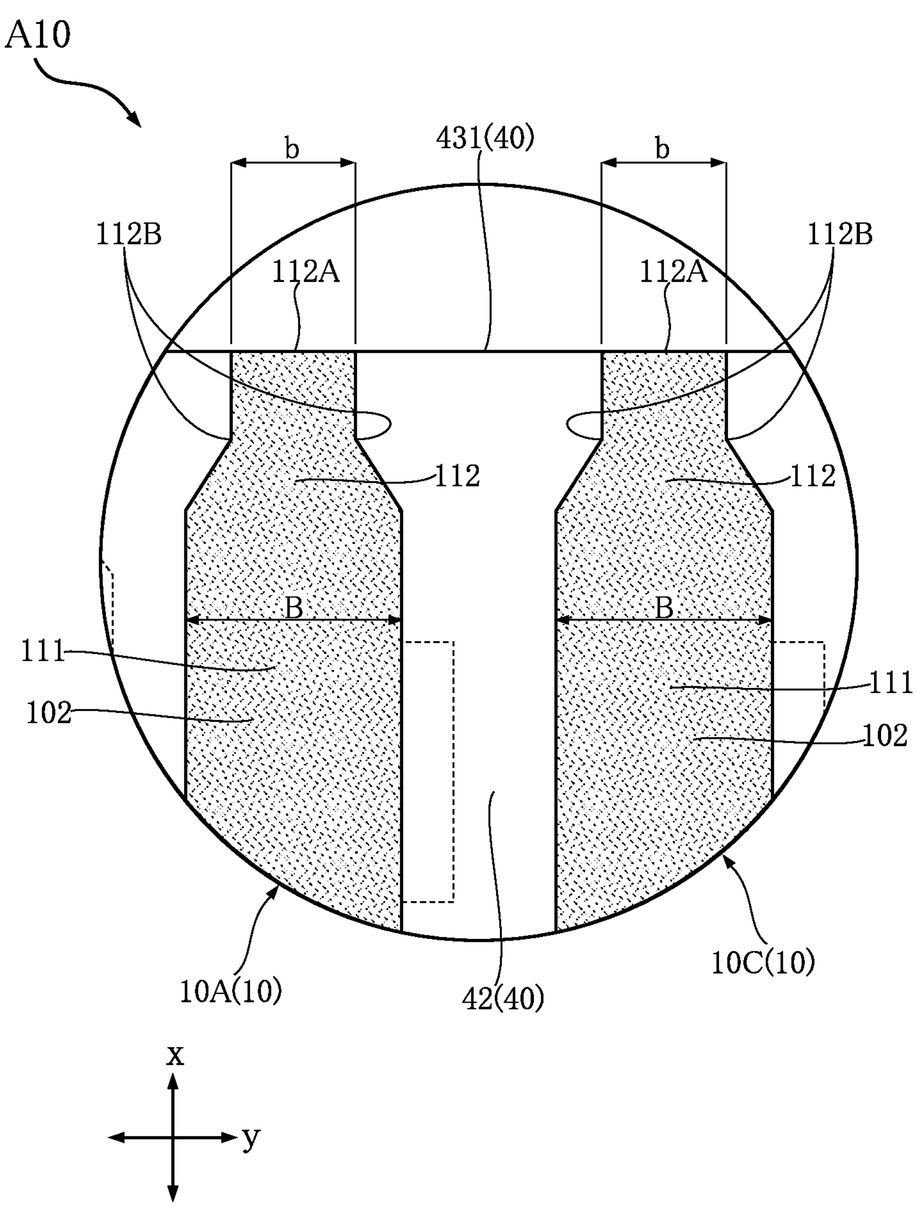
FIG. 9 is an enlarged view of a part of FIG. 3.

As shown in FIG. 9, each of the pair of side sections 112 of the first input terminal 11A and the output terminal 11C is formed with a constriction 112B. The constriction 112B extends from the obverse surface 101 to the reverse surface 102 of the first lead 11 and is recessed from opposite edges in the second direction y toward the inside of the side section 112. The constriction 112B is in contact with the sealing resin 40. In the first input terminal 11A and the output terminal 11C, due to the constriction 112B, the dimension b of each first end surface 112A in the second direction y is smaller than the dimension B of the reverse surface 102 of the main section 111 in the second direction y.

Figure 7:
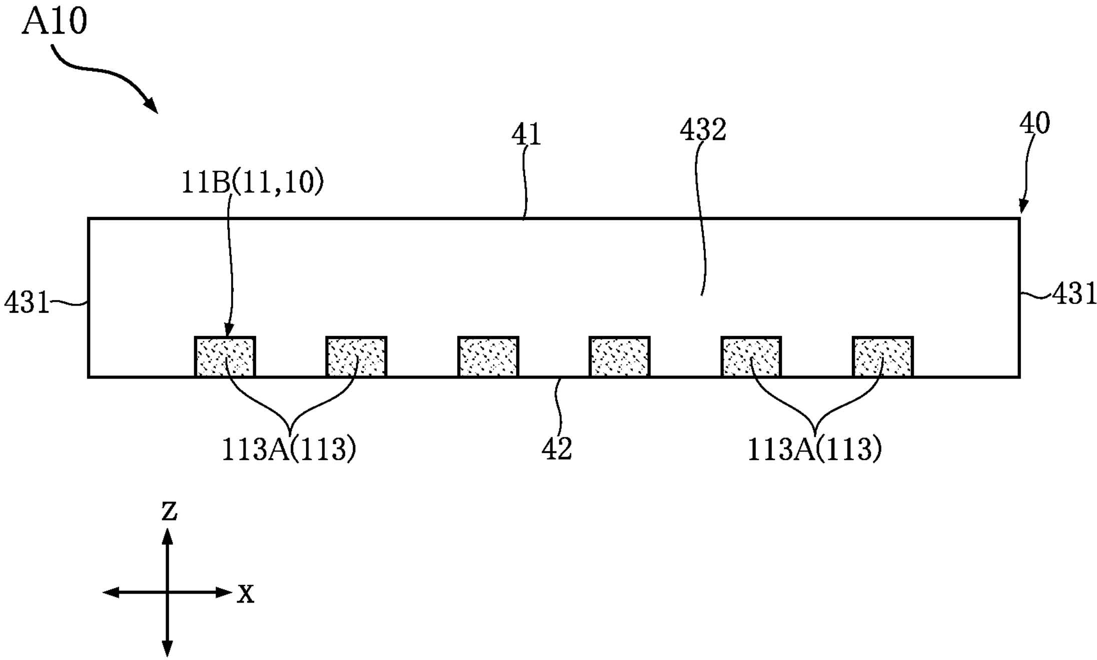
FIG. 7 is a right side view of the semiconductor device shown in FIG. 1.
Figure 11:
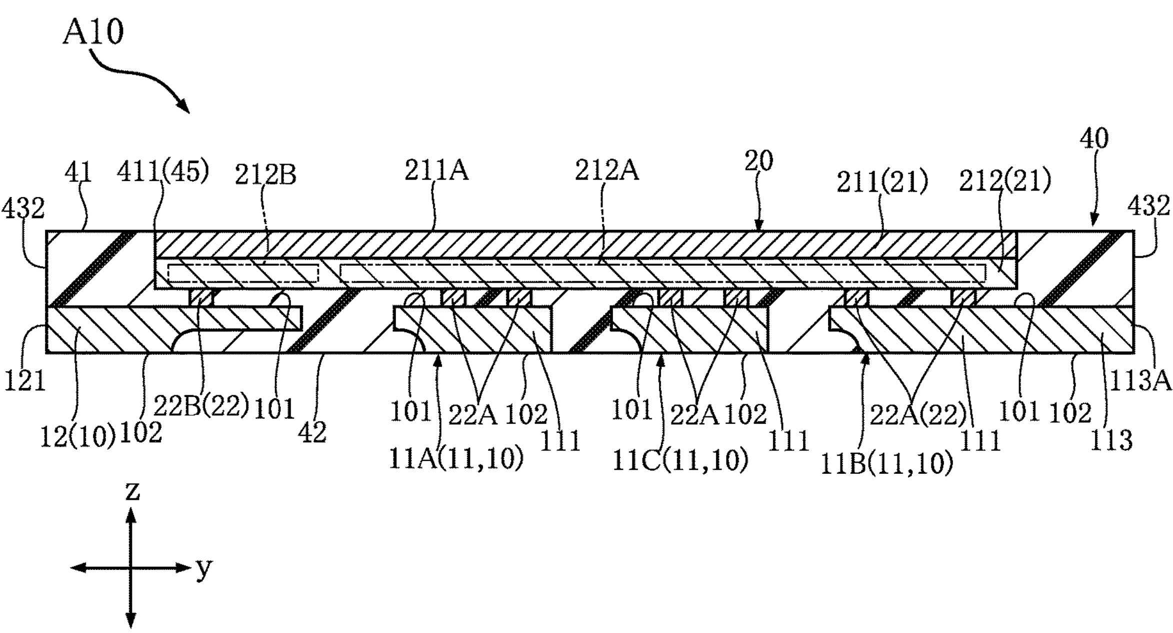
FIG. 11 is a sectional view taken along line XI-XI in FIG. 3.

As shown in FIG. 3, the second input terminal 11B is offset from the output terminal 11C toward the second side in the second direction y. That is, of the plurality of first leads 11, the second input terminal 11B is the one located on the second side in the second direction y. The second input terminal 11B includes a main section 111, a pair of side sections 112, and a plurality of projections 113. The projections 113 project from the main section 111 toward the second side in the second direction y. The space between two adjacent projections 113 is filled with the sealing resin 40. As shown in FIG. 11, each of the projections 113 has a sub-end surface 113A. The sub-end surfaces 113A are connected to both the obverse surface 101 and the reverse surface 102 of the second input terminal 11B and face the second side in the second direction y. The sub-end surfaces 113A are exposed from the sealing resin 40. As shown in FIG. 7, the sub-end surfaces 113A are arranged at predetermined intervals along the first direction x.

Figure 10:
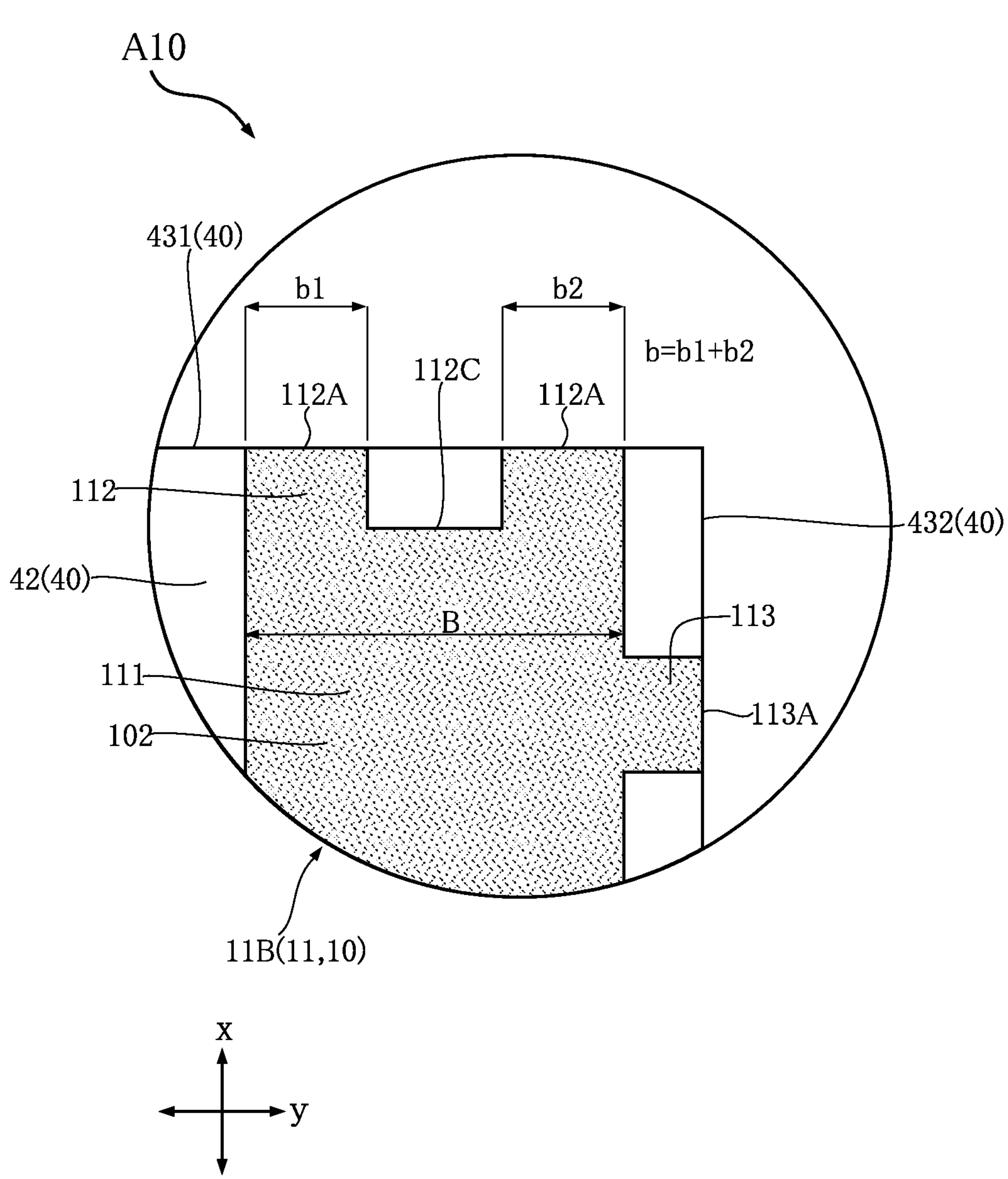
FIG. 10 is an enlarged view of a part of FIG. 3.

As shown in FIG. 10, each of the pair of side sections 112 of the second input terminal 11B is formed with an indentation 112C. The indentation 112C extends from the obverse surface 101 to the reverse surface 102 of the second input terminal 11B and is recessed from the first end surface 112A in the first direction x. Thus, the first end surface 112A is divided into two sections spaced apart from each other in the second direction y. In the second input terminal 11B, due to the indentation 112C, the dimension b of each first end surface 112A in the second direction y is smaller than the dimension B of the reverse surface 102 of the main section 111 in the second direction y. Note that the dimension b herein is the sum (b=b1+b2) of the dimension b1 of one of the sections of the first end surface 112A in the second direction y and the dimension b2 of the other section of the first end surface 112A in the second direction y. The indentation 112C is filled with the sealing resin 40.

As shown in FIGS. 3 and 4, in each of the first leads 11, the obverse surface 101 is larger in area than the reverse surface 102. In the example of the semiconductor device A10, the first input terminal 11A and the output terminal 11C are equal to each other in area of the reverse surface 102. The second input terminal 11B is larger than the first input terminal 11A and the output terminal 11C in area of the reverse surface 102.

In each of the first input terminal 11A, the second input terminal 11B and the output terminal 11C, the obverse surface 101 of the main section 111, which supports the semiconductor element may be plated with silver (Ag). In each of the first input terminal 11A, the second input terminal 11B and the output terminal 11C, the reverse surface 102, the pair of first end surfaces 112A and the sub-end surfaces 113A, which are exposed from the sealing resin 40, may be plated with tin (Sn). Instead of tin-plating, multiple metal-plating layers of e.g. nickel (Ni), palladium (Pd) and gold (Au) layers laminated in the stated order may be employed.

Figure 8:
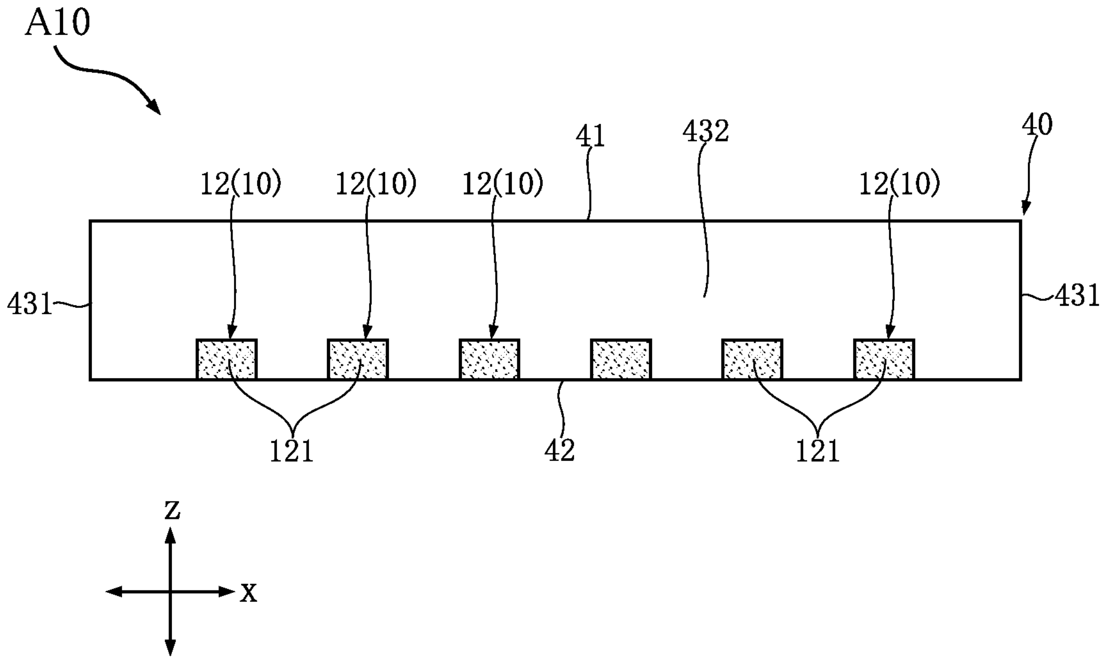
FIG. 8 is a left side view of the semiconductor device shown in FIG. 1.

As shown in FIG. 3, the plurality of second leads 12 are offset from the first leads 11 toward the first side in the second direction y. One of the second leads 12 is a ground terminal of the control circuit 212B contained in the semiconductor element Each of other second leads 12 receives power (voltage) for driving the control circuit 212B or electric signals for transmission to the control circuit 212B. As shown in FIGS. 3, 4 and 11, each of the second leads 12 has a second end surface 121. The second end surfaces 121 are connected to both the obverse surfaces 101 and the reverse surfaces 102 of the second leads 12 and face the first side in the second direction y. The second end surfaces 121 are exposed from the sealing resin 40. As shown in FIG. 8, the second end surfaces 121 are arranged at predetermined intervals along the first direction x.

As shown in FIGS. 3 and 4, in each of the second leads 12, the obverse surface 101 is larger in area than the reverse surface 102. The reverse surfaces 102 of the plurality of second leads 12 are all equal in area. The reverse surfaces 101 of the second leads 12, which support the semiconductor element 20, may be plated with silver. The reverse surfaces 102 and the second end surfaces 121 of the second leads 12, which are exposed from the sealing resin 40, may be plated with tin. Instead of tin-plating, multiple metal-plating layers of, e.g. nickel, palladium and gold layers laminated in the stated order may be employed.

Figure 14:
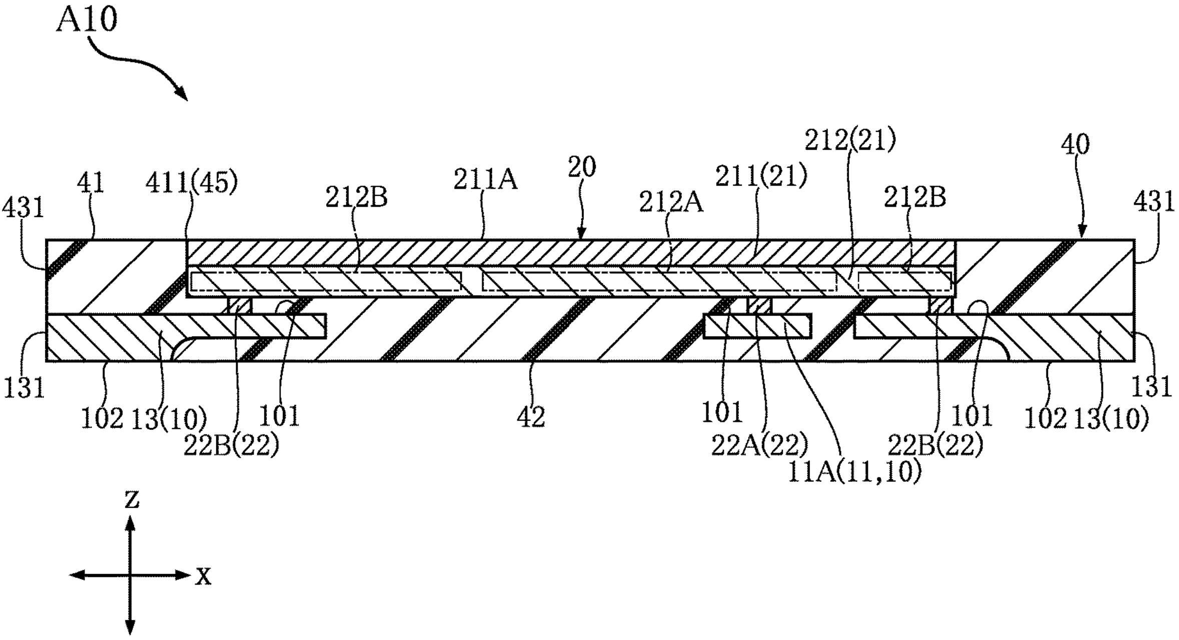
FIG. 14 is a sectional view taken along line XIV-XIV in FIG. 3.

As shown in FIG. 3, the pair of third leads 13 are located between a first lead 11 (the first input terminal 11A) and the plurality of second leads 12 in the second direction y. The third leads 13 are spaced apart from each other in the first direction x. Each of the third leads 13 receives, for example, electric signals for transmission to the control circuit 212B contained in the semiconductor element 20. As shown in FIGS. 3, 4 and 14, each of the third leads 13 has a third end surface 131. The third end surfaces 131 are connected to both the obverse surfaces 101 and the reverse surfaces 102 and face in the first direction x. The third end surfaces 131 are exposed from the sealing resin 40. Each of the third end surfaces 131 is aligned with relevant first end surfaces 112A of the first leads 11 in the second direction y.

As shown in FIGS. 3 and 4, in each of the third leads 13, the obverse surface 101 is larger in area than the reverse surface 102. The obverse surfaces 101 of the third leads 13, which support the semiconductor element 20, may be plated with silver. The reverse surfaces 102 and the third end surfaces 131 of the third leads 13, which are exposed from the sealing resin 40, may be plated with tin. Instead of tin-plating, multiple metal-plating layers of, e.g. nickel, palladium and gold layers laminated in the stated order may be employed.

Figure 15:
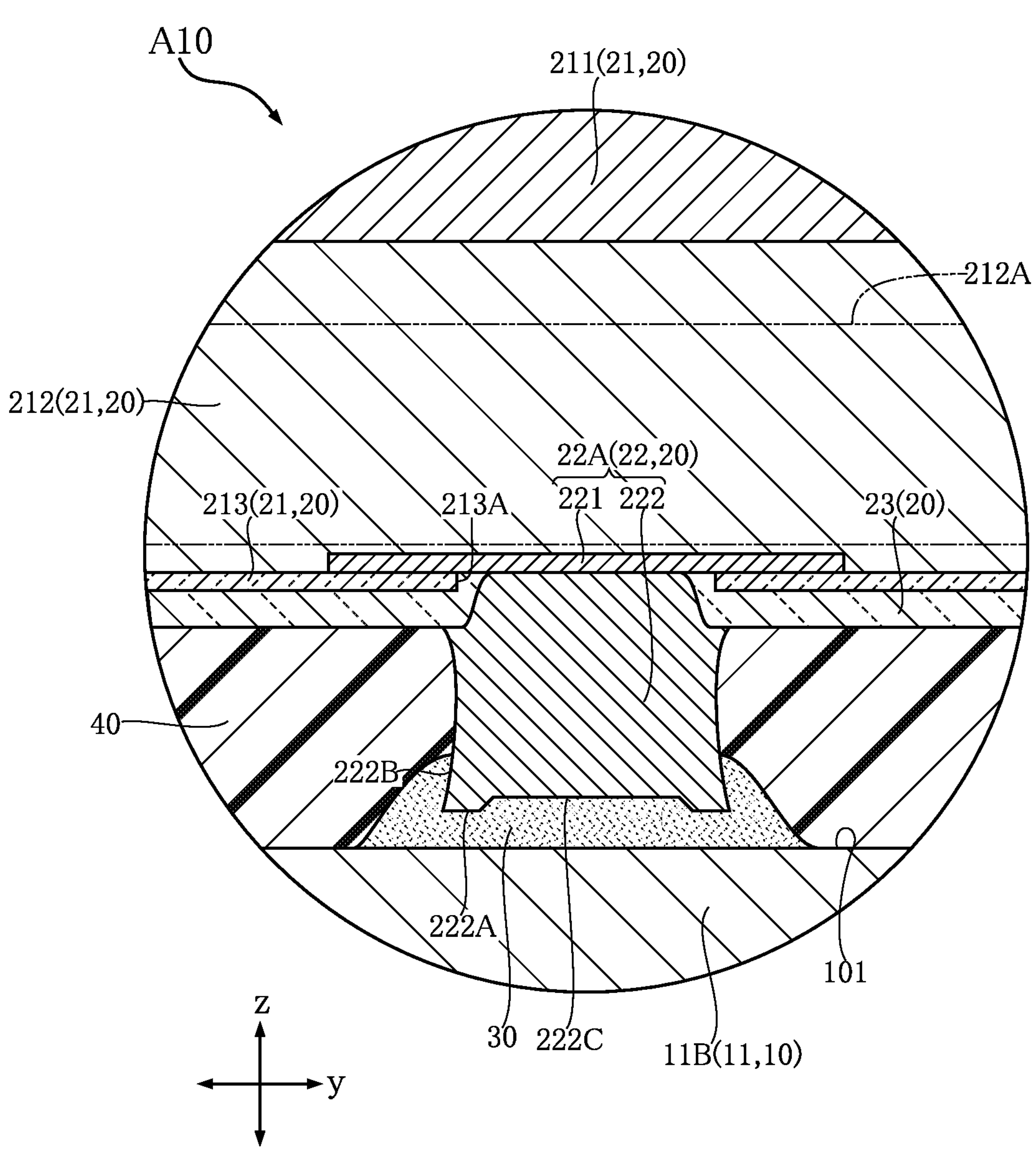
FIG. 15 is an enlarged view of a part of FIG. 11.
Figure 16:
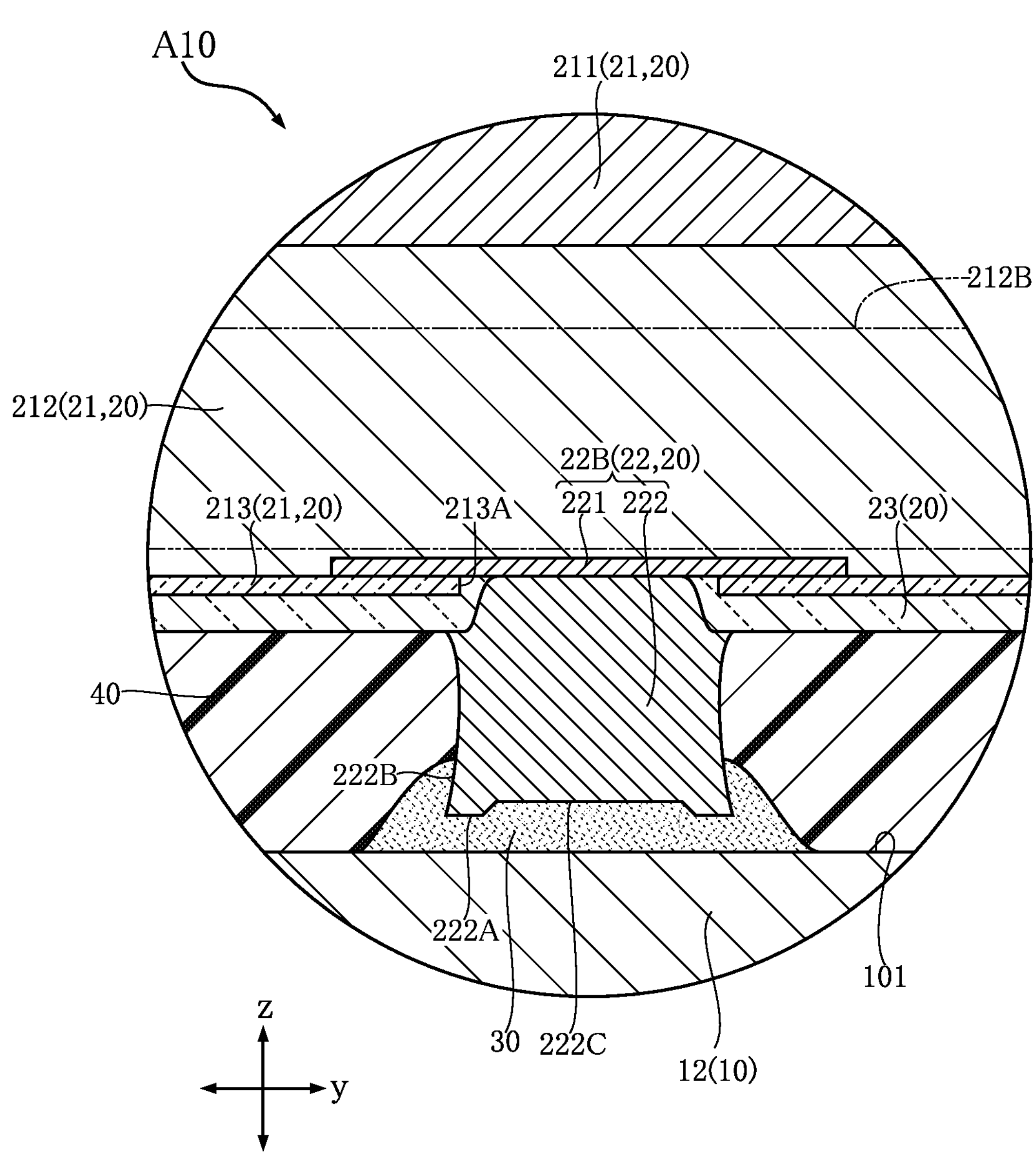
FIG. 16 is an enlarged view of a part of FIG. 11.

As shown in FIGS. 11 to 14, the semiconductor element 20 is bonded to the conductor 10 (the plurality of first leads 11, the plurality of second leads 12 and the pair of third leads 13) by flip-chip bonding and supported on these. The semiconductor element 20 is covered with the sealing resin 40. As shown in FIGS. 15 and 16, the semiconductor element 20 has an element body 21, a plurality of electrodes 22 and a surface protective film 23.

The element body 21 forms the main part of the semiconductor element 20. As shown in FIGS. 15 and 16, the element body 21 has a substrate 211, a semiconductor layer 212, and a passivation film 213.

As shown in FIGS. 15 and 16, the substrate 211 supports below it the semiconductor layer 212, the passivation film 213, the electrodes 22, and the surface protective film 23. The substrate 211 is made of a semiconductor material. The semiconductor material is mainly composed of silicon (Si) or silicon carbide (SiC). The thickness of the substrate 211 is, for example, not less than 100 μm and not more than 300 μm.

As shown in FIGS. 11 to 14, the substrate 211 has a base surface 211A. The base surface 211A faces the same side as the obverse surfaces 101 of the conductor 10 in the thickness direction z.

As shown in FIGS. 11 to 14, the semiconductor layer 212 is located on the side of the substrate 211 that opposes the obverse surface 101 of the conductor 10 in the thickness direction z. The semiconductor layer 212 is on the surface of the substrate 211 that is opposite from the base surface 211A in the thickness direction z. The semiconductor layer 212 may contain various kinds of p-type semiconductors and n-type semiconductors which differ in amount of doped elements. The semiconductor layer 212 contains a switching circuit 212A and a control circuit 212B electrically connected to the switching circuit 212A. The switching circuit 212A may be a MOSFET (Metal-Oxide-Semiconductor Field-Effect Transistor) or an IGBT (Insulated Gate Bipolar Transistor), for example. In the example of the semiconductor device A10, the switching circuit 212A is divided into two regions, i.e., a high-voltage region (upper arm circuit) and a low-voltage region (lower arm circuit). Each region is constituted by a single n-channel MOSFET. The control circuit 212B, containing e.g., a gate driver for driving the switching circuit 212A or a bootstrap circuit for the high-voltage region of the switching circuit 212A, is configured to control the switching circuit 212A. The semiconductor layer 212 is also formed with a conductor layer (not shown). The conductor layer electrically connects the switching circuit 212A and the control circuit 212B to each other.

As shown in FIGS. 15 and 16, the passivation film 213 covers the lower surface of the semiconductor layer 212. The passivation film 213 is electrically insulating. The passivation film 213 is constituted by a silicon oxide ($SiO_2$) film in contact with the lower surface of the semiconductor layer 212, and a silicon nitride ($Si_3N_4$) film laminated on the silicon oxide film. The passivation film 213 is formed with a plurality of openings 213A penetrating in the thickness direction z.

As shown in FIGS. 11 to 14, the electrodes 22 are located on the side that opposes the obverse surfaces 101 of the conductor in the thickness direction z. The electrodes 22 are connected to the element body 21. In the semiconductor device A10, the electrodes 22 project from the element body 21 in the thickness direction z. The electrodes 22 are bonded to the obverse surfaces 101 of the conductor 10. The electrodes 22 include a plurality of first electrodes 22A and a plurality of second electrodes 22B. As shown in FIGS. 2 and 3, as viewed in the thickness direction z, each of the second electrodes 22B is located closer to the periphery of the semiconductor element 20 than any of the first electrodes 22A. At least one of the plurality of electrodes 22 is electrically connected to the switching circuit 212A of the semiconductor layer 212 and bonded to the obverse surface 101 of the relevant one of the first leads 11. At least one of the plurality of electrodes 22 is electrically connected to the control circuit 212B of the semiconductor layer 212 and bonded to the obverse surface 101 of the relevant one of the second leads 12. Also, a pair of second electrodes 22B of the plurality of second electrodes 22B are electrically connected to the control circuit 212B and individually bonded to the obverse surfaces 101 of the pair of third leads 13.

As shown in FIGS. 15 and 16, each of the electrodes 22 has a pad portion 221 and a columnar portion 222. The pad portion 221 is in contact with the semiconductor layer 212 of the element body 21. Thus, each pad portion 221 is electrically connected to the switching circuit 212A of the semiconductor layer 212 or the control circuit 212B of the semiconductor layer 212. Each pad portion 221 contains aluminum (Al) or copper in its composition. As another configuration of the pad portion 221, the pad portion may be made of a plurality of metal layers laminated on the semiconductor layer 212 in the order of, from top to bottom, copper, nickel and palladium. The pad portion 221 is in contact with the passivation film 213 of the element body 21. The pad portion 221 is partially exposed through the opening 213A of the passivation film 213. The columnar portion 222 projects from the part of the pad portion 221 that is exposed through the opening 213A toward an obverse surface 101 of the conductor 10. The columnar portion 222 may be cylindrical, for example. The columnar portion 222 contains copper in its composition. The columnar portion 222 has an end surface 222A, a side surface 222B, and a recess 222C. The end surface 222A opposes the obverse surface 101 of the conductor 10. The side surface 222B is connected to the end surface 222A and faces in a direction orthogonal to the thickness direction z. The recess 222C is recessed from the end surface 222A in the thickness direction z. The electrodes 22 are formed by electroplating.

As shown in FIGS. 15 and 16, the surface protective film 23 covers the side of the element body 21 that opposes the obverse surface 101 of the conductor 10, i.e., the passivation film 213 of the element body 21. In each of the electrodes 22, the end surface 222A of the columnar portion 222 is located between an obverse surface 101 of the conductor 10 and the surface protective film 23 in the thickness direction z. In the semiconductor device A10, the surface protective film 23 is in contact with both the pad portions 221 and the columnar portions 222 of the plurality of electrodes 22. The surface protective film 23 is electrically insulating. The surface protective film 23 may be made of a material containing polyimide, for example.

As shown in FIGS. 15 and 16, the bonding layer 30 is in contact with both the obverse surfaces 101 of the conductor 10 and the plurality of electrodes 22. The bonding layer 30 is electrically conductive. Thus, the electrodes 22 are bonded to the obverse surfaces 101 of the conductor 10 while being electrically connected to the conductor 10. The bonding layer 30 may be, for example, a lead-free solder containing tin and silver in its composition. In each of the electrodes 22, the bonding layer 30 is in contact with both the end surface 222A and the side surface 222B of the columnar portion 222. The bonding layer is urged into the recess 222C of the columnar portion 222.

As shown in FIGS. 5 to 8, the sealing resin 40 has a top surface 41, a bottom surface 42, a pair of first side surfaces 431 and a pair of second side surfaces 432. As shown in FIGS. 1 and 11 to 14, the sealing resin 40 also has an opening 45. The sealing resin 40 may be made of a material containing black epoxy resin, for example.

As shown in FIGS. 11 to 14, the top surface 41 faces the same side as the obverse surfaces 101 of the conductor 10 in the thickness direction z. As shown in FIGS. 5 to 8, the bottom surface 42 faces away from the top surface 41. As shown in FIG. 4, the reverse surfaces 102 of the first leads 11, the reverse surfaces 102 of the second leads 12 and the reverse surfaces 102 of the third leads 13 are exposed from the bottom surface 42.

Figure 12:
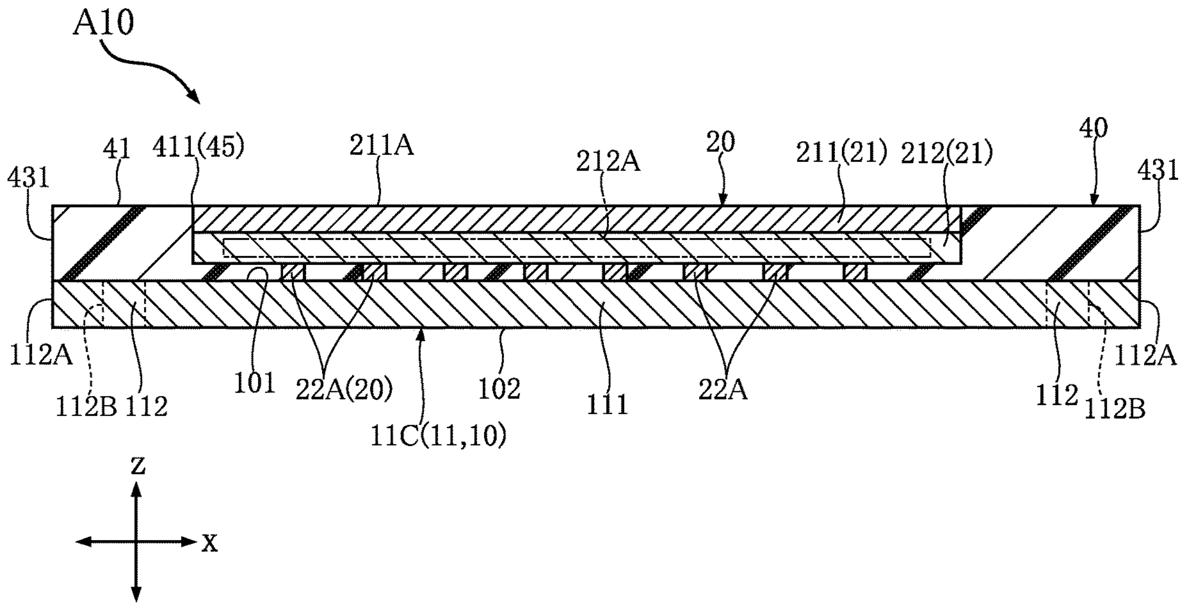
FIG. 12 is a sectional view taken along line XII-XII in FIG. 3.
Figure 13:
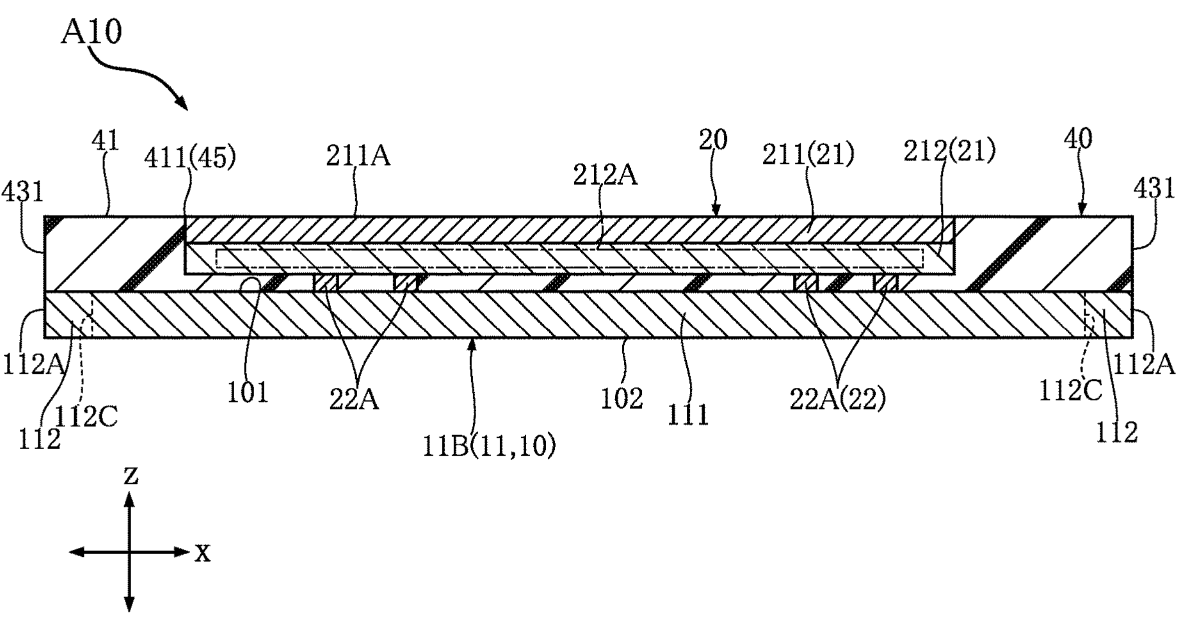
FIG. 13 is a sectional view taken along line XIII-XIII in FIG. 3.

As shown in FIGS. 7 and 8, the pair of first side surfaces 431 are connected to both the top surface 41 and the bottom surface 42 and face in the first direction x. The first side surfaces 431 are spaced apart from each other in the second direction y. As shown in FIGS. 12 to 14, the first end surfaces 112A of the first leads 11 and the third end surfaces 131 of the third leads 13 are exposed from the first side surfaces 431 to be flush with the first side surfaces 431.

Figure 5:
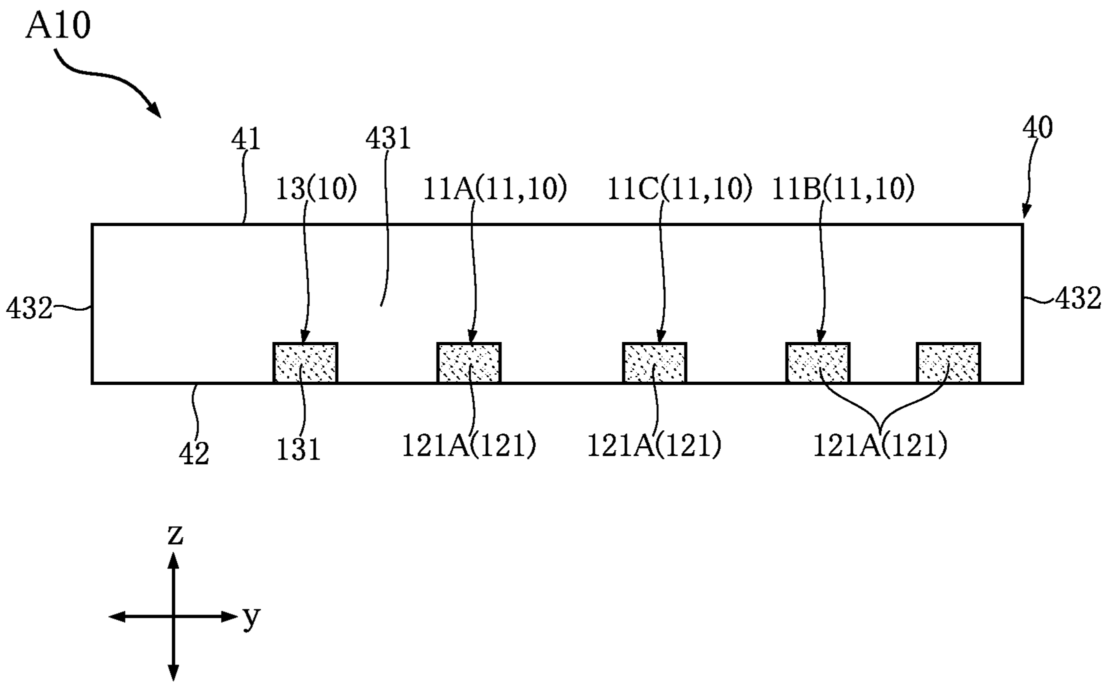
FIG. 5 is a front view of the semiconductor device shown in FIG. 1.
Figure 6:
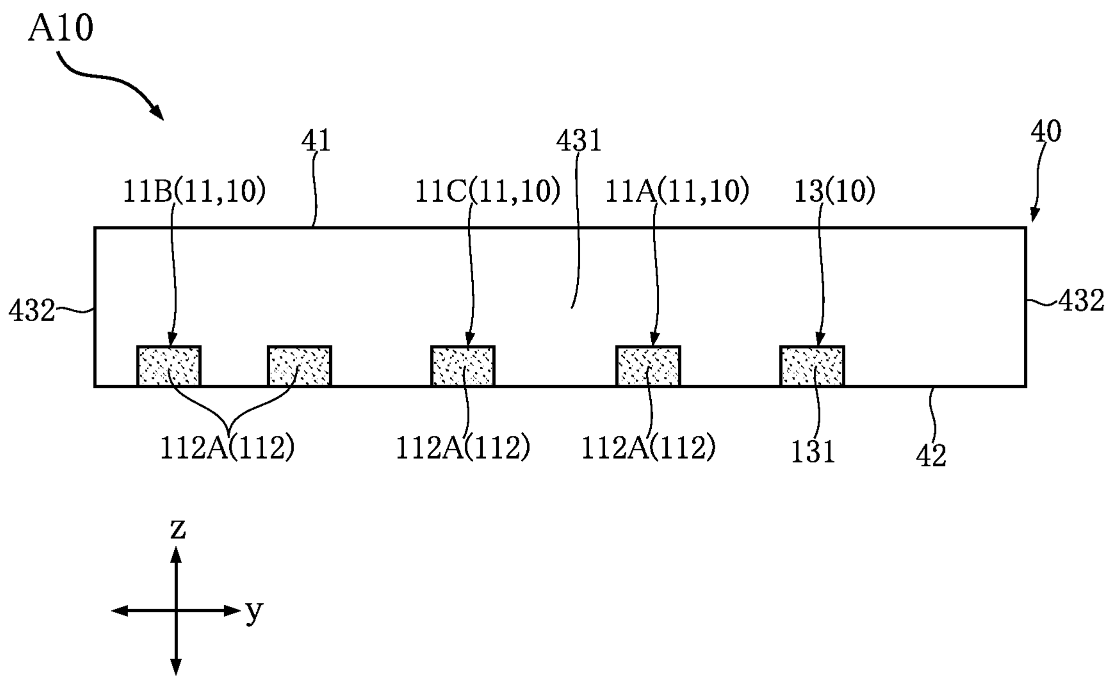
FIG. 6 is a rear view of the semiconductor device shown in FIG. 1.

As shown in FIGS. 5 and 6, the pair of second side surfaces 432 are connected to the top surface 41, the bottom surface 42 and the first side surfaces 431 and face in the second direction y. The second side surfaces 432 are spaced apart from each other in the first direction x. As shown in FIG. 11, the second end surfaces 121 of the second leads 12 are exposed from one of the second side surfaces 432 that is located on the first side in the second direction y to be flush with the second side surface 432. The sub-end surfaces 113A of the second input terminal 11B (one of the first leads 11) are exposed from the other one of the second side surfaces 432 that is located on the second side in the second direction y to be flush with the second side surface 432.

Figure 17:
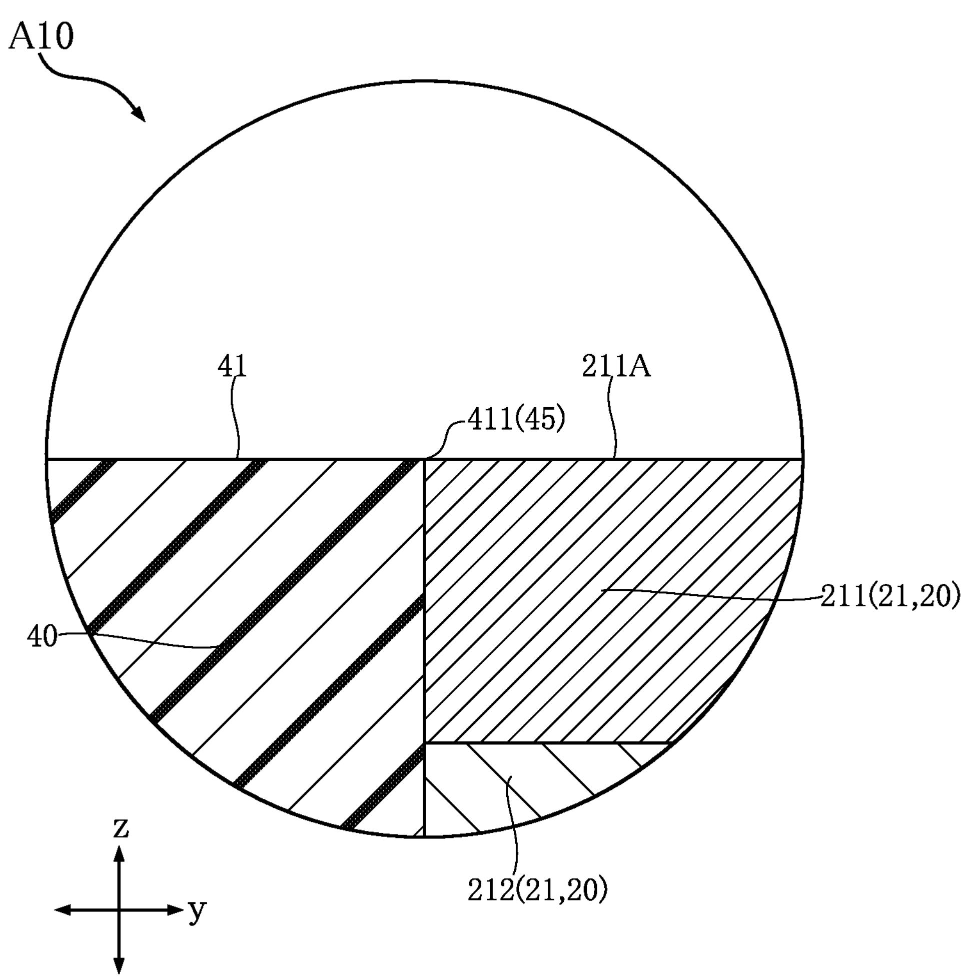
FIG. 17 is an enlarged view of a part of FIG. 11.

As shown in FIGS. 1 and 11 to 14, the opening 45 penetrates the top surface 41 in the thickness direction z. The element body 21 of the semiconductor element 20 is exposed through the opening 45. To be exact, the base surface 211A of the substrate 211 of the element body 21 is exposed through the opening 45. In the semiconductor device A10, the opening 45 is rectangular as viewed in the thickness direction z. Due to the formation of the opening 45 in the sealing resin 40, the top surface 41 has an opening edge 411 defining the opening 45. As shown in FIG. 17, in the semiconductor device A10, the base surface 211A is flush with the top surface 41. The opening edge 411 abuts the periphery of the base surface 211A. This configuration is obtained during manufacture of the semiconductor device A10 by grinding the sealing resin 40 in the thickness direction z with a tool such as a grinder to expose the substrate 211 from the sealing resin 40.

The advantages of the semiconductor device A10 are described below.

The semiconductor device A10 includes a conductor 10 having obverse surfaces 101 facing in the thickness direction z, a semiconductor element 20 having an element body 21 and a plurality of electrode 22 bonded to the obverse surfaces 101, and a sealing resin 40 covering the semiconductor element 20. The sealing resin 40 has an opening 45 penetrating the top surface 41 in the thickness direction z. The element body 21 is exposed through the opening 45. Thus, during the use of the semiconductor device A10, the heat generated from the semiconductor element 20 is dissipated to the outside through the plurality of electrodes 22 and the conductor 10. The heat generated from the semiconductor element 20 is also dissipated from the element body 21 to the outside. In this way, the semiconductor device A10 is configured to dissipate heat from both sides of the semiconductor element 20 in the thickness direction z. Thus, the semiconductor device A10 can improve the heat dissipation of the device.

Each of the electrodes 22 has a pad portion 221 and a columnar portion 222. The columnar portion 222 has a shorter length and a larger cross sectional area than a bonding wire. Thus, the parasitic resistance between the first leads 11 and the switching circuit 212A can be reduced as compared with a case in which the first leads 11 and the pad portions 221 are connected with bonding wires. The reduced parasitic resistance has the effect of reducing the on-resistance and noise in the switching circuit 212A.

The columnar portion 222 of each of the electrodes 22 is formed with a recess 222C recessed from the end surface 222A toward the element body 21. The bonding layer 30 is urged into the recess 222C. The columnar portion 222 having such a configuration provides an anchoring effect on the bonding layer 30. This improves the bonding strength between the columnar portion 222 and the bonding layer 30.

The semiconductor layer 212 of the element body 21 of the semiconductor element 20 contains a switching circuit 212A. At least one of the electrodes 22 is electrically connected to the switching circuit 212A. The reverse surface 102 of each of the first leads 11, which are included in the conductor 10 and to which at least one of the electrodes 22 is bonded, is exposed from the bottom surface 42 of the sealing resin 40. With such a configuration, the heat generated from the semiconductor element due to the driving of the switching circuit 212A is efficiently dissipated to the outside during the use of the semiconductor device A10.

Each of the first leads 11 has a main section 111 elongated in the first direction x and a pair of side sections 112 connected to opposite ends of the main section 111 in the first direction x. Each of the pair of side sections 112 has a first end surface 112A facing in the first direction x and exposed from a first side surface 431 of the sealing resin 40. Each first end surface 112A is flush with the first side surface 431. In the second direction y, the dimension b of each first end surface 112A is smaller than the dimension B of the reverse surface 102 of the main section 111. With such a configuration, the area of each first end surface 112A can be made smaller than that in a conventional QFN-type semiconductor device. Thus, in manufacturing the semiconductor device A10, generation of metal burrs on the first end surfaces 112A can be reduced during the blade dicing for division into individual pieces. Reduced metal burrs allows easy and reliable mounting of the semiconductor device A10 to a circuit board.

As shown in FIG. 9, each of the pairs of side sections 112 of the first leads 11 (the first input terminal 11A and the output terminal 11C) is formed with a constriction 112B. Thus, the dimension b of each first end surface 112A can be made smaller than the dimension B of the reverse surface 102 of the main section 111. The constriction 112B is in contact with the sealing resin 40 in the first direction x. This prevents the first leads 11 from falling off through the first side surfaces 431 of the sealing resin 40.

As shown in FIG. 10, each of the pair of side sections 112 of a first lead 11 (the second input terminal 11B) is formed with an indentation 112C. With such a configuration again, the dimension b of each first end surface 112A can be made smaller than the dimension B of the reverse surface 102 of the main section 111 of the first lead 11. The indentation 112C is filled with the sealing resin 40. Thus, the first lead 11 is in contact with the sealing resin 40 in the first direction x. This prevents the first lead 11 from falling off through the first side surfaces 431 of the sealing resin 40.

The second input terminal 11B includes a plurality of projections 113 projecting from the second side of the main section 111 in the second direction y. Each of the projections 113 has a sub-end surface 113A facing in the second direction y. The sub-end surfaces 113A are exposed from one of the second side surfaces 432 of the sealing resin 40 that is located on the second side in the second direction y. Thus, the second input terminal 11B is in contact with the sealing resin 40 on the second side in the second direction y. Thus, the second input terminal 11B is prevented from falling off through the second side surface 432 on the second side in the second direction y.

In each of the first leads 11, the obverse surface 101 is larger in area than the reverse surface 102. Thus, each first lead 11 is in contact with the sealing resin 40 on the reverse surface 102 side in the thickness direction z. With such a configuration, the first leads 11 are prevented from falling off through the bottom surface 42 of the sealing resin 40. Moreover, the obverse surface 101 of each first lead 11, on which at least one of the electrodes 22 is bonded, can have a relatively large area. This allows mounting a larger number of electrodes 22 on the first leads 11.

The conductor 10 further includes a plurality of second leads 12 on each of which at least one electrode 22 is bonded. In each of the second leads 12, the obverse surface 101 is made larger in area than the reverse surface 102. With such a configuration, as with the relationship between the obverse surface 101 and the reverse surface 102 of the first leads 11, the second leads 12 are prevented from falling off through the bottom surface 42 of the sealing resin 40. Moreover, each second lead 12, on which at least one of the electrodes 22 is bonded, can have a relatively large area. This allows mounting a larger number of electrodes 22 on the second leads 12.

A semiconductor device A20 according to a second embodiment of the present disclosure is described below with reference to FIGS. 18 and 19. In these figures, the elements that are identical or similar to those of the semiconductor device A10 described above are denoted by the same reference signs, and the descriptions thereof are omitted. Note that FIG. 18 is a sectional view taken along the same plane as FIG. 11.

The semiconductor device A20 differs from the semiconductor device A10 in configuration of the element body 21 of the semiconductor element 20 and the sealing resin 40.

Figure 18:
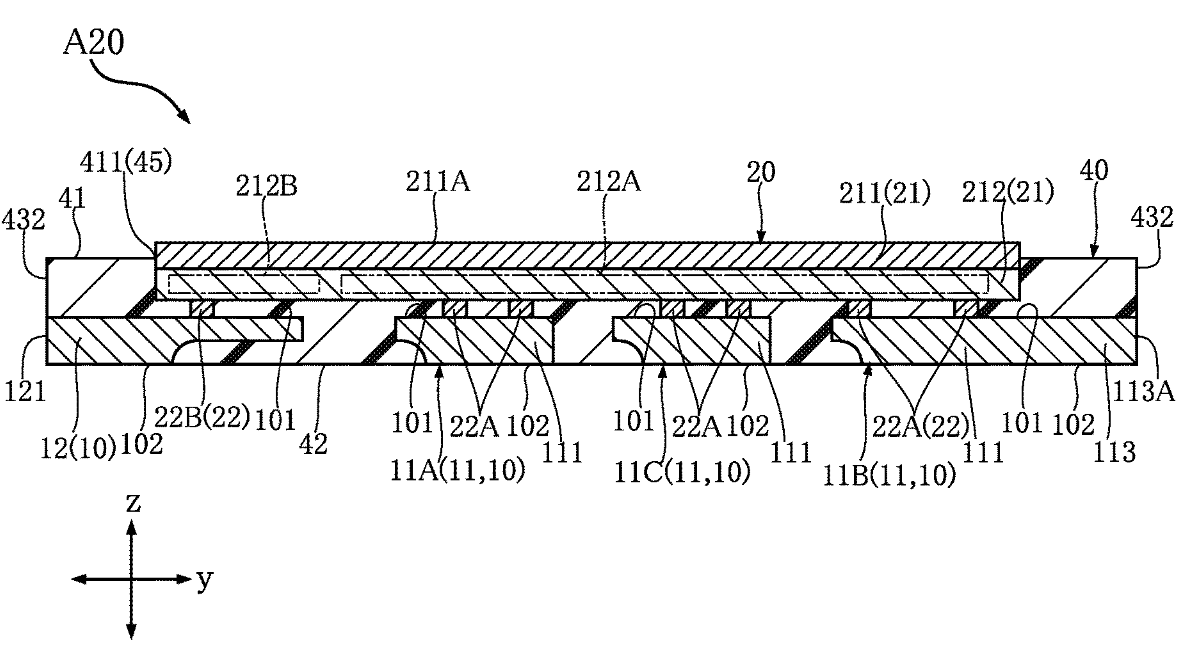
FIG. 18 is a sectional view of a semiconductor device according to a second embodiment of the present disclosure.
Figure 19:
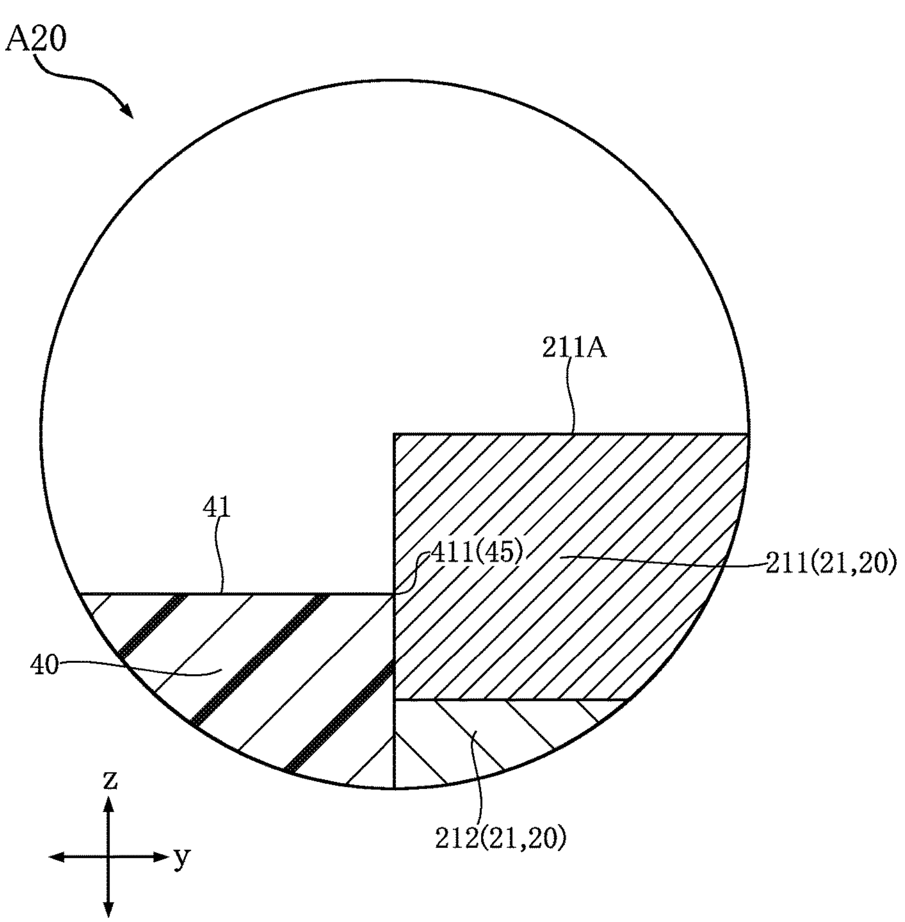
FIG. 19 is an enlarged view of a part of FIG. 18.

As shown in FIGS. 18 and 19, in the semiconductor device A20, the base surface 211A of the substrate 211 of the element body 21 (semiconductor element 20) is located further away from the obverse surfaces 101 of the conductor 10 than is the top surface 41 of the sealing resin 40 in the thickness direction z. The substrate 211 partially projects from the top surface 41 in the thickness direction z. The opening edge 411 defining the opening of the sealing resin 40 is located away from the base surface 211A in the thickness direction z. This configuration is obtained during manufacture of the semiconductor device A20 by removing a part of the sealing resin 40 that surrounds the base surface 211A with a chemical solution, for example, after the substrate 211 is exposed from the sealing resin 40 as with the semiconductor device A10.

The advantages of the semiconductor device A20 are described below.

The semiconductor device A20 includes a conductor 10 having obverse surfaces 101 facing in the thickness direction z, a semiconductor element 20 having an element body 21 and a plurality of electrode 22 bonded to the obverse surfaces 101, and a sealing resin 40 covering the semiconductor element 20. The sealing resin has an opening 45 penetrating the top surface 41 in the thickness direction z. The element body 21 is exposed through the opening 45. Thus, the semiconductor device A20 can also improve the heat dissipation of the device.

In the semiconductor device A20, the base surface 211A of the substrate 211 of the element body 21 (semiconductor element 20) is located further away from the obverse surfaces 101 of the conductor 10 than is the top surface 41 of the sealing resin 40 in the thickness direction z. With such a configuration, the surface area of the portion of the substrate 211 that is exposed from the sealing resin 40 is larger than that in the semiconductor device A10. Thus, the semiconductor device A20 can further improve the heat dissipation.

A semiconductor device A30 according to a third embodiment of the present disclosure is described below with reference to FIGS. 20 to 22. In these figures, the elements that are identical or similar to those of the semiconductor device A10 described above are denoted by the same reference signs, and the descriptions thereof are omitted.

The semiconductor device A30 differs from the semiconductor device A10 in configuration of the element body 21 of the semiconductor element 20 and the sealing resin 40.

Figure 21:
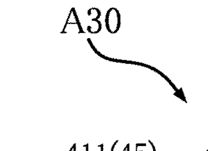
FIG. 21 is a sectional view taken along line XXI-XXI in FIG. 20.
Figure 21:
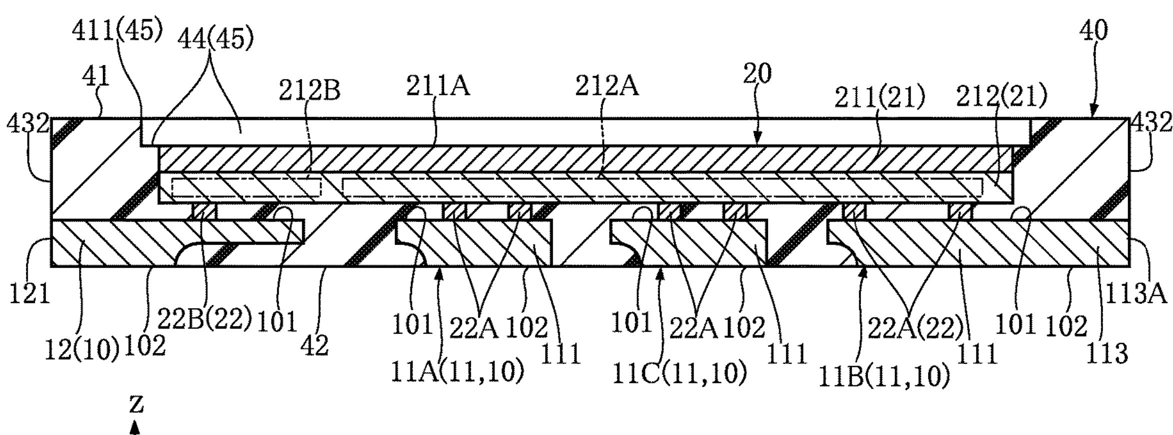
Figure 22:
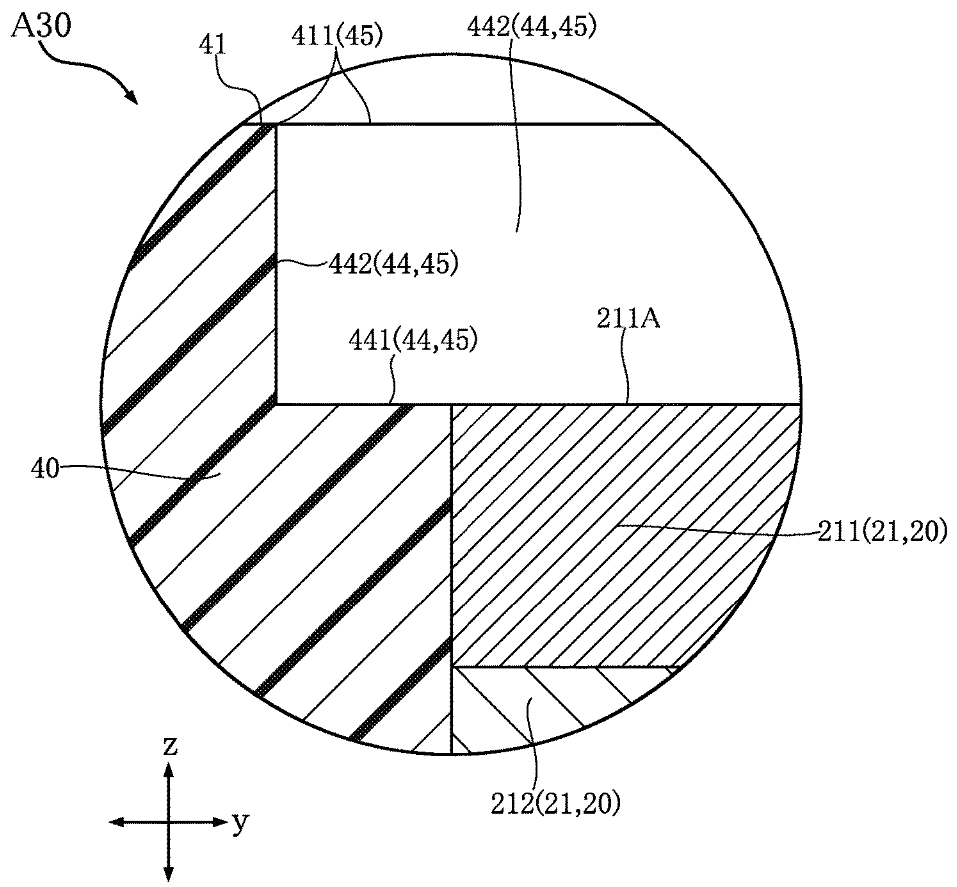
FIG. 22 is an enlarged view of a part of FIG. 21.

As shown in FIGS. 21 and 22, in the semiconductor device A30, the base surface 211A of the substrate 211 of the element body 21 (semiconductor element 20) is located closer to the obverse surfaces 101 of the conductor 10 than is the top surface 41 of the sealing resin 40 in the thickness direction z. Thus, the opening 45 formed in the sealing resin 40 is recessed from the top surface 41 in the thickness direction z. Moreover, the opening edge 411 defining the opening 45 is located away from the base surface 211A in the thickness direction z. This configuration is obtained by processing the mold used for transfer-molding of the sealing resin 40 in the manufacture of semiconductor device A30.

Figure 20:
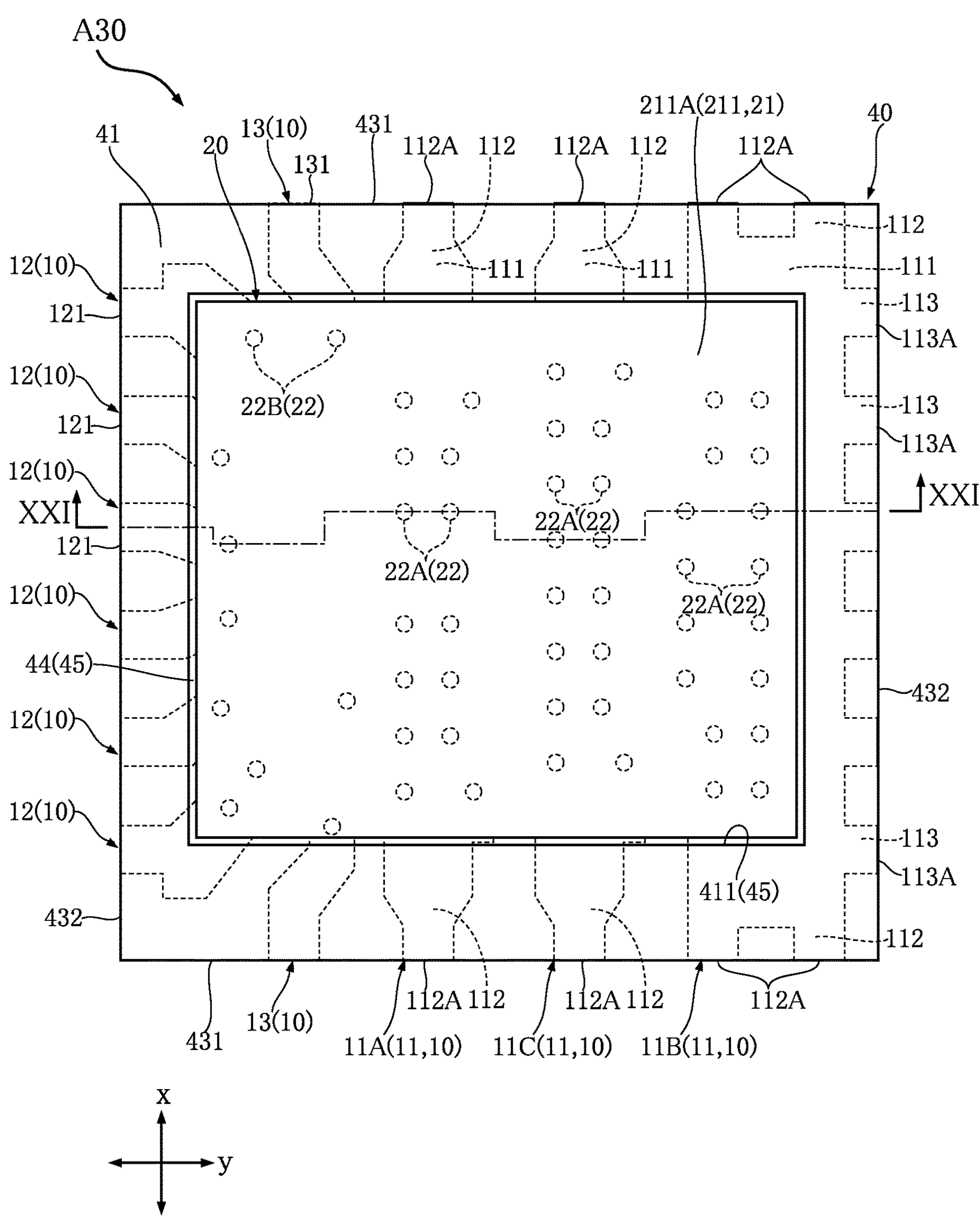
FIG. 20 is a plan view of a semiconductor device according to a third embodiment of the present disclosure.

As shown in FIG. 20, as viewed in the thickness direction z, the opening edge 411 is located outwardly away from the base surface 211A of the substrate 211. Thus, the sealing resin 40 has an opening surface 44 connected to the opening edge 411 and defining the opening 45. As shown in FIGS. 21 and 22, the opening surface 44 abuts the periphery of the base surface 211A.

As shown in FIGS. 21 and 22, the opening surface 44 includes a first section 441 and a second section 442. The first section 441 is located between the top surface 41 of the sealing resin 40 and the obverse surfaces 101 of the conductor 10 in the thickness direction z and parallel to the top surface 41. The first section 441 abuts the periphery of the base surface 211A of the substrate 211. The second section 442 is connected to the first section 441 and the opening edge 411. In the semiconductor device A30, the second section 442 stands upright with respect to the first section 441.

The advantages of the semiconductor device A30 are described below.

The semiconductor device A30 includes a conductor 10 having obverse surfaces 101 facing in the thickness direction z, a semiconductor element 20 having an element body 21 and a plurality of electrode 22 bonded to the obverse surfaces 101, and a sealing resin 40 covering the semiconductor element 20. The sealing resin has an opening 45 penetrating the top surface 41 in the thickness direction z. The element body 21 is exposed through the opening 45. Thus, the semiconductor device A30 can also improve the heat dissipation of the device.

In the semiconductor device A30, the base surface 211A of the substrate 211 of the element body 21 (semiconductor element is located closer to the obverse surfaces 101 of the conductor than is the top surface 41 of the sealing resin 40 in the thickness direction. Thus, the opening 45 is recessed from the top surface 41 in the thickness direction z. With such a configuration, the opening 45 can be filled with an electrically insulating material with relatively high thermal conductivity to improve heat dissipation of the semiconductor device A30 while protecting the element body 21 from the external environment.

A semiconductor device A40 according to a fourth embodiment of the present disclosure is described below with reference to FIG. 23. In these figures, the elements that are identical or similar to those of the semiconductor device A10 described above are denoted by the same reference signs, and the descriptions thereof are omitted. Note that FIG. 23 is a sectional view taken along the same plane as FIG. 22.

The semiconductor device A40 differs from the semiconductor device A30 in configuration of the opening surface 44 of the sealing resin 40.

Figure 23:
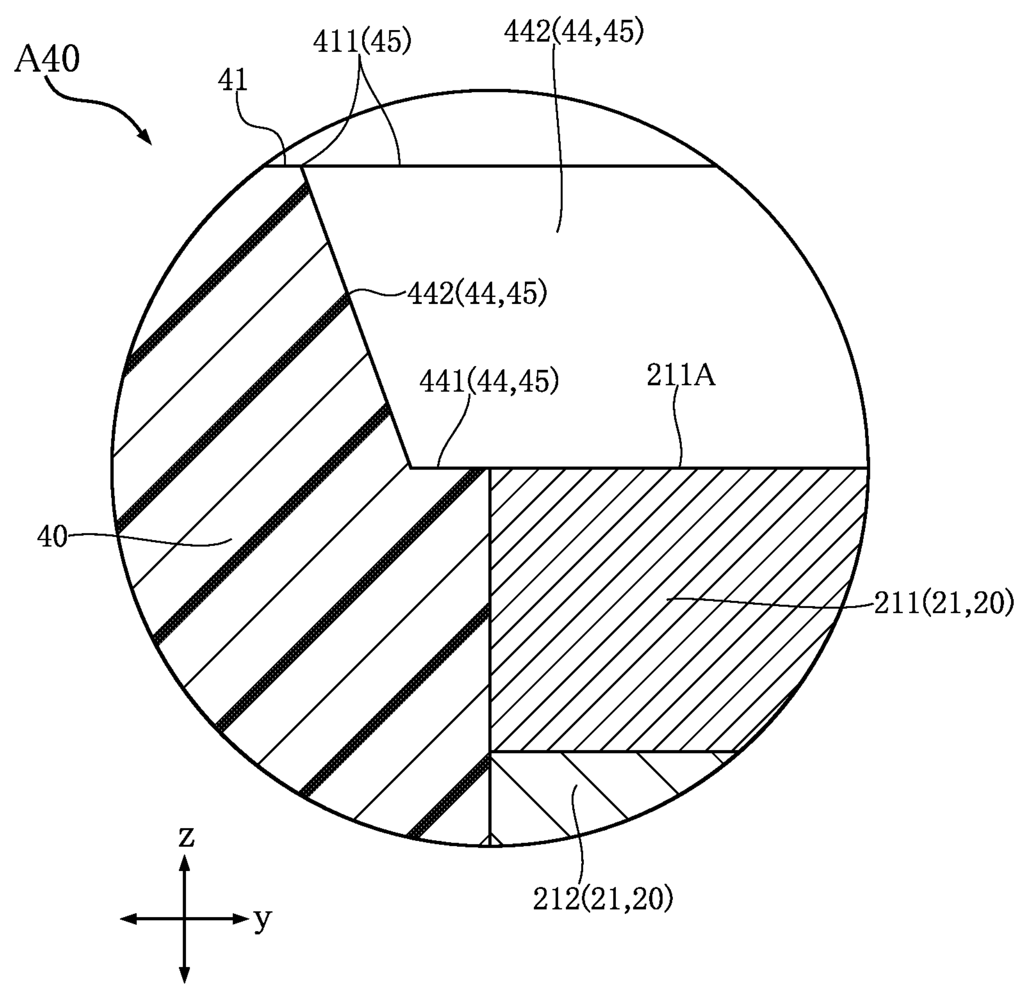
FIG. 23 is an enlarged view of a part of a semiconductor device according to a fourth embodiment of the present disclosure.

As shown in FIG. 23, in the semiconductor device A40, the second section 442 of the opening surface 44 is inclined with respect to both the first section 441 of the opening surface 44 and the top surface 41 of the sealing resin 40. As viewed in the thickness direction z, the area of the opening 45 gradually reduces from the top surface 41 toward the obverse surfaces 101 of the conductor 10.

The advantages of the semiconductor device A40 are described below.

The semiconductor device A40 includes a conductor 10 having obverse surfaces 101 facing in the thickness direction z, a semiconductor element 20 having an element body 21 and a plurality of electrode 22 bonded to the obverse surfaces 101, and a sealing resin 40 covering the semiconductor element 20. The sealing resin 40 has an opening 45 penetrating the top surface 41 in the thickness direction z. The element body 21 is exposed through the opening 45. Thus, the semiconductor device A40 can also improve the heat dissipation of the device.

In the semiconductor device A40, the second section 442 of the opening surface 44 of the sealing resin 40 is inclined with respect to both the first section 441 of the opening surface 44 and the top surface 41 of the sealing resin 40. As viewed in the thickness direction z, the area of the opening 45 gradually reduces from the top surface 41 toward the obverse surfaces 101 of the conductor 10. With such a configuration, in forming the sealing resin 40 by transfer molding in the manufacture of the semiconductor device A40, the part of the mold used to form the opening 45 can be smoothly pulled out from the sealing resin 40.

In the semiconductor devices A10 to A40, the conductor 10 includes a plurality of leads (the plurality of first leads 11, the plurality of second leads 12, and the pair of third leads 13) made of a same lead frame. As another example, the conductor 10 may be a conductor layer formed on an insulating layer and including a plurality of separate sections.

The present disclosure is not limited to the foregoing embodiments. The specific configuration of each part of the present disclosure may be varied in design in many ways.

REFERENCE NUMERALS

A10, A20, A30, A40: Semiconductor device
10: Conductor 101: Obverse surface
102: Reverse surface 11: First lead
11A: First input terminal 11B: Second input terminal
11C: Output terminal 111: Main section
112: Side section 112A: First end surface
112B: Constriction 112C: Indentation
113: Projection 113A: Sub-end surface
12: Second lead 121: Second end surface
13: Third lead 131: Third end surface
20: Semiconductor element 21: Element body
211: Substrate 211A: Base surface
212: Semiconductor layer 212A: Switching circuit
212B: Control circuit 213: Passivation film
213A: Opening 22: Electrode
22A: First electrode 22B: Second electrode
221: Pad portion 222: Columnar portion
222A: End surface 222B: Side surface
222C: Recess 23: Surface protective film
231: Opening 30: Bonding layer
40: Sealing resin 41: Top surface
411: Opening edge 42: Bottom surface
431: First side surface 432: Second side surface
44: Opening surface 441: First section
442: Second section 45: Opening
B: Dimension b, b1, b2: Dimension
h1, h2: Height z: Thickness direction
x: First direction y: Second direction

The invention claimed is:

1. A semiconductor device comprising:

a conductor having an obverse surface facing in a thickness direction;

a semiconductor element including an element body and a plurality of electrodes, the plurality of electrodes being connected to the element body and bonded to the obverse surface; and a sealing resin covering the semiconductor element, wherein the sealing resin has a top surface and an opening, the top surface facing a same side as the obverse surface in the thickness direction, the opening penetrating the top surface in the thickness direction, the element body includes: a substrate made of a semiconductor material; and a semiconductor layer located closer to the obverse surface than is the substrate in the thickness direction and electrically connected to the plurality of electrodes, the substrate has a base surface facing the same side as the obverse surface in the thickness direction, the base surface is exposed through the opening, the base surface is located closer to the obverse surface than is the top surface in the thickness direction, the top surface includes an opening edge defining the opening in a manner such that the opening overlaps but extends beyond the base surface as viewed in the thickness direction, the sealing resin has as an opening surface connected to the opening edge and defining the opening, the opening surface includes a first section located between the top surface and the obverse surface in the thickness direction and parallel to the top surface, and a second section connected to the first section and the opening edge, the second section is inclined with respect to both the first section and the top surface, an area of the opening as viewed in the thickness direction gradually reduces from the top surface toward the base surface, the first section is flanked by the base surface and the second section in a first direction orthogonal to the thickness direction, and a dimension of the first section in the first direction is smaller than a dimension of the second section in the thickness direction.

2. The semiconductor device according to claim 1, further comprising:

a conductive bonding layer that bonds the obverse surface and the plurality of electrodes to each other, wherein each of the plurality of electrodes has a pad portion that is in contact with the element body and a columnar portion projecting from the pad portion in the thickness direction, the columnar portion being in contact with the bonding layer.

3. The semiconductor device according to claim 2, wherein the columnar portion of each of the plurality of electrodes has an end surface opposing the obverse surface, and a side surface connected to the end surface and facing in a direction orthogonal to the thickness direction, and the bonding layer is in contact with the end surface and the side surface.

4. The semiconductor device according to claim 3, wherein the semiconductor element has a surface protective film opposing the obverse surface in the thickness direction and covering the element body, the end surface of each of the plurality of electrodes is located between the obverse surface and the surface protective film in the thickness direction.

5. The semiconductor device according to claim 4, wherein the pad portion and the columnar portion of each of the plurality of electrodes are in contact with the surface protective film.

6. The semiconductor device according to claim 4, wherein the columnar portion of each of the plurality of electrodes has a recess that is recessed from the end surface in the thickness direction, and the bonding layer is urged into the recess.

7. The semiconductor device according to claim 1, wherein the conductor includes a plurality of first leads and a plurality of second leads, the plurality of first leads are elongated in a first direction orthogonal to the thickness direction and spaced apart from each other in a second direction orthogonal to the thickness direction and the first direction, the plurality of second leads are spaced apart from the plurality of first leads in the second direction, the semiconductor layer contains a switching circuit and a control circuit electrically connected to the switching circuit, a first electrode of the plurality of electrodes is electrically connected to the switching circuit and bonded to the obverse surface of one of the plurality of first leads, and a second electrode of the plurality of electrodes is electrically connected to the control circuit and bonded to the obverse surface of one of the plurality of second leads.

8. The semiconductor device according to claim 7, wherein the sealing resin covers a portion of each of the plurality of first leads and a portion of each of the plurality of second leads, each of the first leads and each of the second leads have respective reverse surfaces opposite from the obverse surface in the thickness direction, and respective end surfaces connected to the obverse surface and the reverse surfaces and facing in a direction orthogonal to the thickness direction, and the reverse surface and the end surface of each of the first leads and the reverse surface and the end surface of each of the second leads are exposed from the sealing resin.

9. A semiconductor device comprising:

a conductor having an obverse surface facing in a thickness direction;

a semiconductor element including an element body and a plurality of electrodes, the plurality of electrodes being connected to the element body and bonded to the obverse surface; and a sealing resin covering the semiconductor element, wherein the sealing resin has a top surface and an opening, the top surface facing a same side as the obverse surface in the thickness direction, the opening penetrating the top surface in the thickness direction, the element body includes: a substrate made of a semiconductor material; and a semiconductor layer located closer to the obverse surface than is the substrate in the thickness direction and electrically connected to the plurality of electrodes, the substrate has a base surface facing the same side as the obverse surface in the thickness direction, the base surface is exposed through the opening, the conductor includes a plurality of first leads and a plurality of second leads, the plurality of first leads are elongated in a first direction orthogonal to the thickness direction and spaced apart from each other in a second direction orthogonal to the thickness direction and the first direction, the plurality of second leads are spaced apart from the plurality of first leads in the second direction, the plurality of first leads and the plurality of second leads each have a reverse surface opposite to the obverse surface in the thickness direction, the plurality of first leads include an input terminal to which direct voltage is applied, the input terminal includes a main section elongated in the first direction and a pair of side sections connected to opposite ends of the main section in the first direction, each of the side sections includes an end surface connected to the obverse surface and the reverse surface of the input terminal, the end surface facing in the first direction, each of the side sections is formed with a constriction, and in each of the side sections, the constriction causes a dimension of the end surface in the second direction to be smaller than a dimension of the reverse surface of the main section in the second direction.

10. The semiconductor device according to claim 9, wherein the semiconductor layer contains a switching circuit and a control circuit electrically connected to the switching circuit, a first electrode of the plurality of electrodes is electrically connected to the switching circuit and bonded to the obverse surface of one of the plurality of first leads, and a second electrode of the plurality of electrodes is electrically connected to the control circuit and bonded to the obverse surface of one of the plurality of second leads.

11. The semiconductor device according to claim 9, wherein the base surface is flush with the top surface.

12. The semiconductor device according to claim 9, wherein the base surface is located further away from the obverse surface than is the top surface in the thickness direction.

13. The semiconductor device according to claim 9, wherein the base surface is located closer to the obverse surface than is the top surface in the thickness direction.

14. The semiconductor device according to claim 13, wherein the top surface includes an opening edge defining the opening in a manner such that the opening overlaps but extends beyond the base surface as viewed in the thickness direction.

15. The semiconductor device according to claim 14, wherein the sealing resin has as an opening surface connected to the opening edge and defining the opening, and the opening surface abuts a periphery of the base surface.

16. The semiconductor device according to claim 15, wherein the opening surface includes:

a first section located between the top surface and the obverse surface in the thickness direction and parallel to the top surface, and a second section connected to the first section and the opening edge, wherein further the first section abuts the periphery of the base surface.

17. The semiconductor device according to claim 16, wherein the second section is inclined with respect to both the first section and the top surface.

18. The semiconductor device according to claim 17, wherein an area of the opening as viewed in the thickness direction gradually reduces from the top surface toward the obverse surface.

19. The semiconductor device according to claim 9, further comprising:

a conductive bonding layer that bonds the obverse surface and the plurality of electrodes to each other, wherein each of the plurality of electrodes has a pad portion that is in contact with the element body and a columnar portion projecting from the pad portion in the thickness direction, the columnar portion being in contact with the bonding layer.

20. The semiconductor device according to claim 19, wherein the columnar portion of each of the plurality of electrodes has an end surface opposing the obverse surface, and a side surface connected to the end surface and facing in a direction orthogonal to the thickness direction, and the bonding layer is in contact with the end surface and the side surface.

* * * * *